(12) United States Patent
Lin

(10) Patent No.: US 10,070,548 B2
(45) Date of Patent: Sep. 4, 2018

(54) CIRCUIT BOARD HOUSING ASSEMBLY

(71) Applicant: MICROELECTRONICS TECHNOLOGY, INC., Hsinchu (TW)

(72) Inventor: Yu Cheng Lin, Hsinchu (TW)

(73) Assignee: Microelectronics Technology, Inc., Hsinchu (TW)

( * ) Notice: Subject to any disclaimer, the term of this patent is extended or adjusted under 35 U.S.C. 154(b) by 0 days.

(21) Appl. No.: 15/368,194

(22) Filed: Dec. 2, 2016

(65) Prior Publication Data
US 2018/0160560 A1    Jun. 7, 2018

(51) Int. Cl.
*H05K 5/00* (2006.01)
*H05K 7/14* (2006.01)

(52) U.S. Cl.
CPC ......... *H05K 7/1407* (2013.01); *H05K 7/1415* (2013.01); *H05K 7/1427* (2013.01)

(58) Field of Classification Search
CPC .. H05K 7/1407; H05K 7/1415; H05K 7/1427; H05K 7/1402; H05K 7/1417
USPC .......... 361/754, 601, 679.01, 748, 752, 755, 361/756, 760
See application file for complete search history.

(56) References Cited

U.S. PATENT DOCUMENTS 7,405,942 B1    7/2008  Lewis
2009/0282666 A1  11/2009  Zheng et al.

FOREIGN PATENT DOCUMENTS

| TW | 204009   | 4/1993 |
| TW | M284776 U | 1/2006 |
| TW | M426679 U | 4/2012 |
| TW | M508769 U | 9/2015 |

OTHER PUBLICATIONS

Search report from the European patent office for application No. 16202242.0-1803 dated May 17, 2017.

*Primary Examiner* — Tremesha S Willis
(74) *Attorney, Agent, or Firm* — Muncy, Geissler, Olds & Lowe, P.C.

(57) ABSTRACT

A circuit board housing assembly includes a housing; a circuit board having an opening attached to the housing; and a board removal tool having a holding member, a rivet and a pin. The holding member has an aperture corresponding to the opening and the rivet is inserted in the opening and the aperture. The rivet has a head with a proximal end and a distal end and a central axis, the head has an internal passage extending parallel to the central axis from the proximal end to the distal end, and the distal end is mechanically connected to legs extending distally from the head and having an internal surface facing the central axis. When the pin is inserted into the internal passage along a direction from the proximal end towards the distal end, the pin applies force to the internal surface of the at least two legs in a direction perpendicular to the central axis.

8 Claims, 22 Drawing Sheets

CIRCUIT BOARD HOUSING ASSEMBLY

TECHNICAL FIELD

The present disclosure relates to a circuit board housing assembly, and more particularly, to a circuit board housing assembly with a board removal tool for removing the circuit board from the housing.

DISCUSSION OF THE BACKGROUND

In many electronics systems, including computer systems, a large number of electronic components, which make up the computer system, generally are arranged on one or more circuit boards. Typically these circuit boards are arranged in parallel within a housing. With the increased use of electronic products in the office environment, electromagnetic interference ("EMP") and radio-frequency interference ("RFI") have become important considerations in the design of such products. Various techniques have been proposed for using the housing to shield electrical components on printed circuit boards in order to limit the emission of EMI and RFI created by electronic products, or to protect such products from external sources of EMI and RFI that could affect their operation.

From time to time, the removal of the printed circuit board from the housing is required to accomplish various functions. For example, an existing printed circuit board may be replaced by an improved version offering superior operating characteristics. Another example is replacement of a printed circuit board that has been diagnosed as defective. Insertion of the new printed circuit board must be preceded by removal of the old or existing printed circuit board from the housing.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides a circuit board housing assembly with a board removal tool for removing the circuit board from the housing.

In some embodiments of the present disclosure, a circuit board housing assembly comprises a housing; a circuit board attached to the housing, wherein the circuit board includes at least one opening; and a board removal tool comprising a holding member, at least one rivet and at least one pin. In some embodiments of the present disclosure, the holding member has at least one aperture corresponding to the at least one opening of the circuit board; the at least one rivet is inserted in the at least one opening and the at least one aperture, the at least one rivet has a head with a proximal end and a distal end and a central axis, the head has an internal passage extending substantially parallel to the central axis from the proximal end to the distal end of the head, and the distal end of the head is mechanically connected to at least two legs extending distally from the head and having an internal surface that faces the central axis; and when the at least one pin is inserted into the internal passage along a direction from the proximal end towards the distal end of the head of the at least one rivet, the at least one pin contacts the internal surface of the at least two legs to apply force on the at least two legs in a direction substantially perpendicular to the central axis.

In some embodiments of the present disclosure, a circuit board housing assembly comprises a housing; a circuit board attached to the housing, wherein the circuit board includes at least one opening having a first opening width along a first direction and a second opening width along a second direction, and the second opening width is smaller than the first opening width; and a board removal tool comprising a holding member including at least one pin having a recessed portion between a head and a flange, the flange having a first axis along a first direction and a second axis along a second direction, the second axis being smaller than the first axis, wherein after the flange of the at least one pin is inserted into the at least one opening in a manner of the first axis being aligned with the first direction, the at least one pin is rotated such that the first axis is not aligned with the first direction.

In some embodiments of the present disclosure, a circuit board housing assembly comprises a housing; a circuit board attached to the housing, wherein the circuit board includes at least one opening having a wide portion and a narrow portion; and a board removal tool comprising a holding member including at least one pin having a recessed portion between a head and a flange, wherein after the flange of the at least one pin is inserted into the wide portion of the at least one opening, the at least one pin is laterally moved such that the recessed portion is positioned in the narrow portion.

In some embodiments of the present disclosure, the housing includes a base and a wall disposed on the base, and a height of the circuit board is smaller than a height of the wall.

In some embodiments of the present disclosure, the circuit board includes a first surface and a second surface, the holding member is positioned on the first surface, and the second surface faces the base of the housing.

In some embodiments of the present disclosure, after the at least one pin contacts the internal surface of the at least two legs to forcibly expand the at least two legs in a direction substantially perpendicular to the central axis, the at least two legs are blocked by the circuit board from passing through the at least one opening of the circuit board.

In some embodiments of the present disclosure, when the at least one pin is moved into the internal passage, the at least two legs are forcibly expanded in a direction substantially perpendicular to the central axis.

In some embodiments of the present disclosure, the at least one rivet comprises a recessed portion between the head and the at least two legs, and the holding member comprises a washer portion in the at least one aperture, and the washer portion is disposed in the recessed portion.

In some embodiments of the present disclosure, each of the at least two legs has a tapering portion.

In some embodiments of the present disclosure, the circuit board is attached to the housing by a bonding material.

In some embodiments of the present disclosure, after the at least one pin is rotated such that the first axis is not aligned with the first direction, the flange is blocked by the circuit board from passing through the at least one opening of the circuit board.

In some embodiments of the present disclosure, after the at least one pin is laterally moved such that the recessed portion is positioned in the narrow portion, the flange is blocked by the circuit board from passing through the at least one opening of the circuit board.

In some embodiments of the present disclosure, the washer portion has an opening, and the width of the opening of the washer portion is smaller than the width of the head of the rivet, and larger than the width of the recessed portion of the rivet.

In some embodiments of the present disclosure, the washer portion has an opening, the at least one pin of the board removal tool has a wide pillar and a narrow pillar, and the width of the opening of the washer portion is smaller than the width of the wide pillar of the pin, and larger than the width of the narrow pillar.

In some embodiments of the present disclosure, the width of the recessed portion is smaller than the width of the second opening width of the at least one opening.

In some embodiments of the present disclosure, the width of the recessed portion is smaller than the width of the narrow portion of the at least one opening, and the width of the flange is larger than the width of the narrow portion of the at least one opening.

From time to time, the removal of the printed circuit board from the housing is required to accomplish various functions. In case the circuit board is assembled to the housing with a bonding material in a compact manner, i.e., a gap between the wall of the housing and an edge of the circuit board is too small for inserting a board-removing tool through the small gap or the edge of the circuit board. Consequently, the height of the wall and the small gap between the wall and the circuit board prevent a board-removing tool from inserting into the second surface through the small gap or the edge of the circuit board.

The present disclosure provides a circuit board housing assembly with a board removal tool for removing the circuit board from the housing, in the absence of using a tool configured for inserting into the second surface of the circuit board from the edge of the circuit board or the gap between the circuit board and the housing. In some embodiments of the present disclosure, the board removal tool may use an opening of the circuit board, wherein the opening may be designed for fastening the circuit board onto the base of the housing by a bolt. In some embodiments of the present disclosure, the board removal tool may use a newly designed opening on the circuit board. In some embodiments of the present disclosure, some parts of the board removal tool are inserted into the opening, and the parts are forcibly expanded such that the parts are blocked by the circuit board from passing through the at least one opening of the circuit board. In some embodiments of the present disclosure, some parts of the board removal tool are inserted into the opening, and the parts are either rotated or laterally moved such that the parts of the board removal tool are blocked by the circuit board.

Consequently, the parts of the board removal tool are blocked by the circuit board from passing through the at least one opening of the circuit board. As a result, the board removal tool can apply a force along a direction from the second surface to the first surface of the circuit board so as to implement the removal of the circuit board from the housing, in the absence of using a tool configured for inserting into the second surface of the circuit board from the edge of the circuit board or the gap between the circuit board and the housing.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "some embodiments," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a circuit board housing assembly with a board removal tool for removing the circuit board from the housing. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
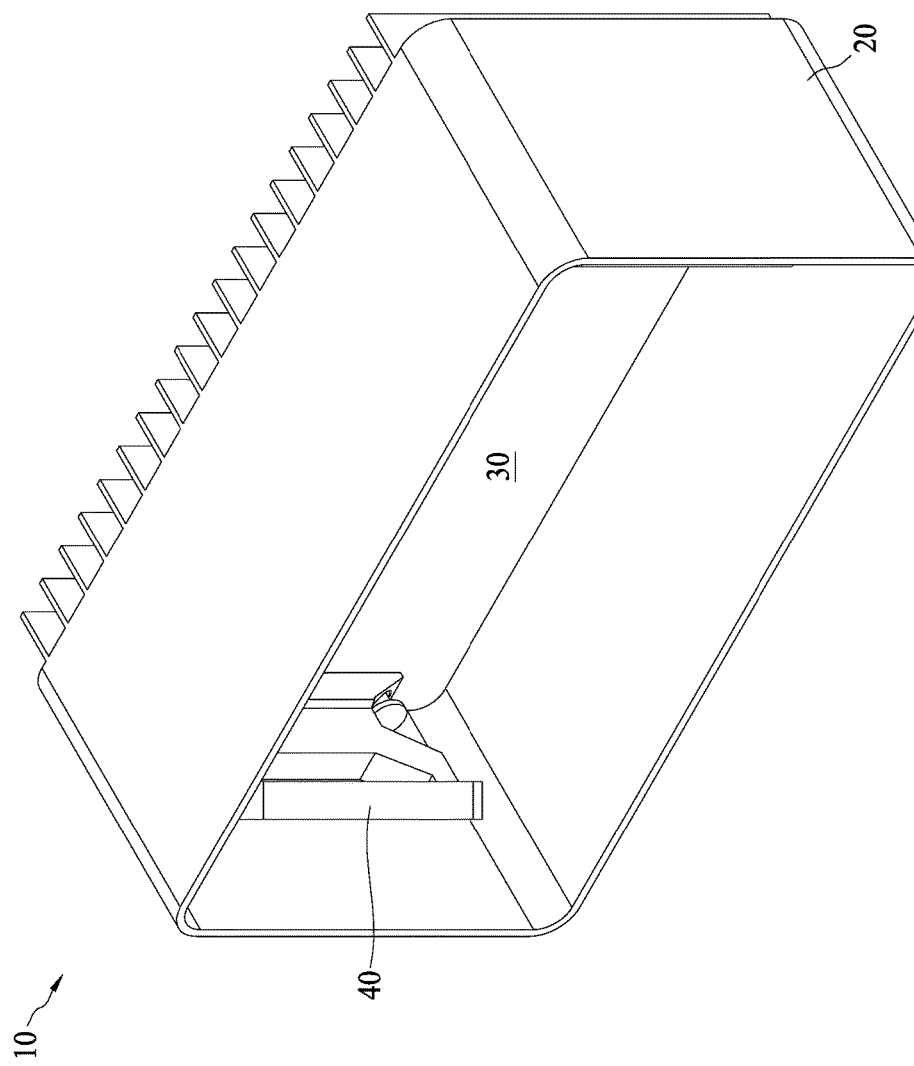
FIG. 1 is an assembled view of a circuit board housing assembly according to some embodiments of the present disclosure.
Figure 2:
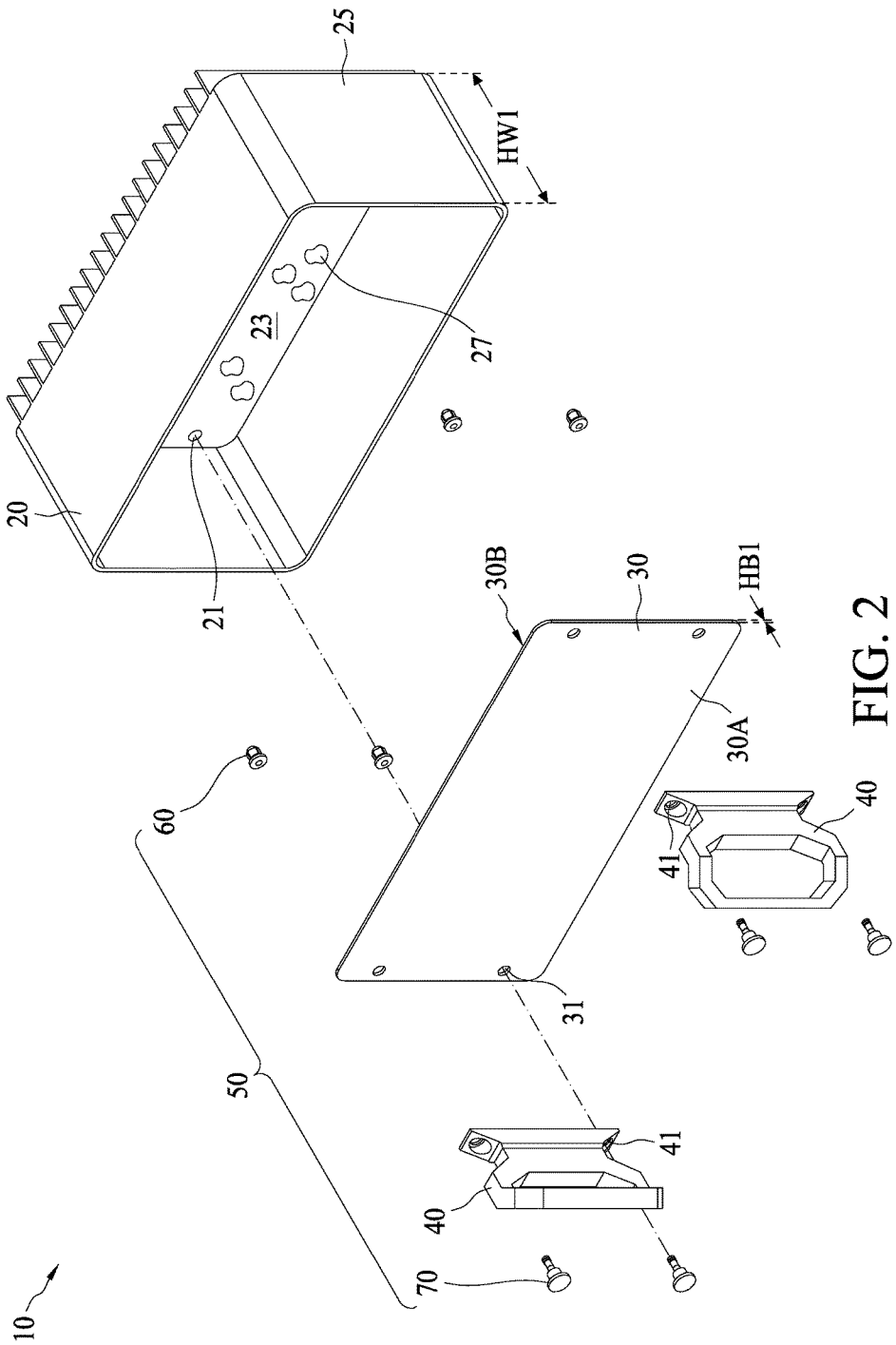
FIG. 2 is a disassembled view of the circuit board housing assembly in FIG. 1 according to some embodiments of the present disclosure.

FIG. 1 is an assembled view of a circuit board housing assembly 10 according to some embodiments of the present disclosure, and FIG. 2 is a disassembled view of the circuit board housing assembly 10 in FIG. 1 according to some embodiments of the present disclosure. In some embodiments of the present disclosure, the circuit board housing assembly 10 comprises a housing 20 including at least one screw hole 21, a circuit board 30 attached to the housing 20, wherein the circuit board 30 includes at least one opening 31 corresponding to the at least one screw hole 21; and a board removal tool 50 comprising a holding member 40, at least one rivet 60 and at least one pin 70. In some embodiments of the present disclosure, the circuit board housing assembly 10 may further comprises a cover (not shown in the drawing) configured for covering the housing 20 so as to isolate the interior of the housing 20 from the external environment.

In some embodiments of the present disclosure, the housing 20 includes a base 23 and a wall 25 disposed on the base 23, and a height (HB1) of the circuit board 30 is smaller than a height (HW1) of the wall 25. In some embodiments of the present disclosure, the circuit board 30 includes a first surface (front surface) 30A and a second surface (back surface) 30B, wherein the second surface 30B faces the base 23 of the housing 20, and the holding member 40 is positioned on the first surface 30A. In some embodiments of the present disclosure, the circuit board 30 is attached to the base 23 of the housing 20 by a bonding material 27, including but not limited to adhesive and thermal gel.

In some embodiments of the present disclosure, the circuit board 30 is assembled to the housing 20 with the bonding material 27 in a compact manner, i.e., a gap between the wall 25 of the housing 20 and an edge of the circuit board 30 is too small for inserting a board-removing tool through the small gap or the edge of the circuit board 30. Consequently, the height (HW1) of the wall 25 and the small gap between the wall 25 and the circuit board 30 prevent a board-removing tool from inserting into the second surface 30B through the small gap or the edge of the circuit board 30.

In some embodiments of the present disclosure, the holding member 40 has at least one aperture 41 corresponding to the at least one opening 31 of the circuit board 30, and the at least one rivet 60 and the at least one pin 70 are disposed in the at least one opening 31. In some embodiments of the present disclosure, the at least one screw hole 21, the at least one opening 31, the at least one rivet 60, the at least one aperture 41, and the at least one pin 70 are designed to be aligned with each other.

In some embodiments of the present disclosure, the circuit board 30 is a multi-layer printed circuit board (multi-layer PCB) comprising a plurality of dielectric layers and metal layers, with electronic components. For example, such electronic components might include, but are not limited to, rectifiers for a power supply, high-power transistors, high-power attenuators, processors, and memories. In some embodiments of the present disclosure, the circuit board housing assembly 10 can be considered an electronics system.

Figure 3:
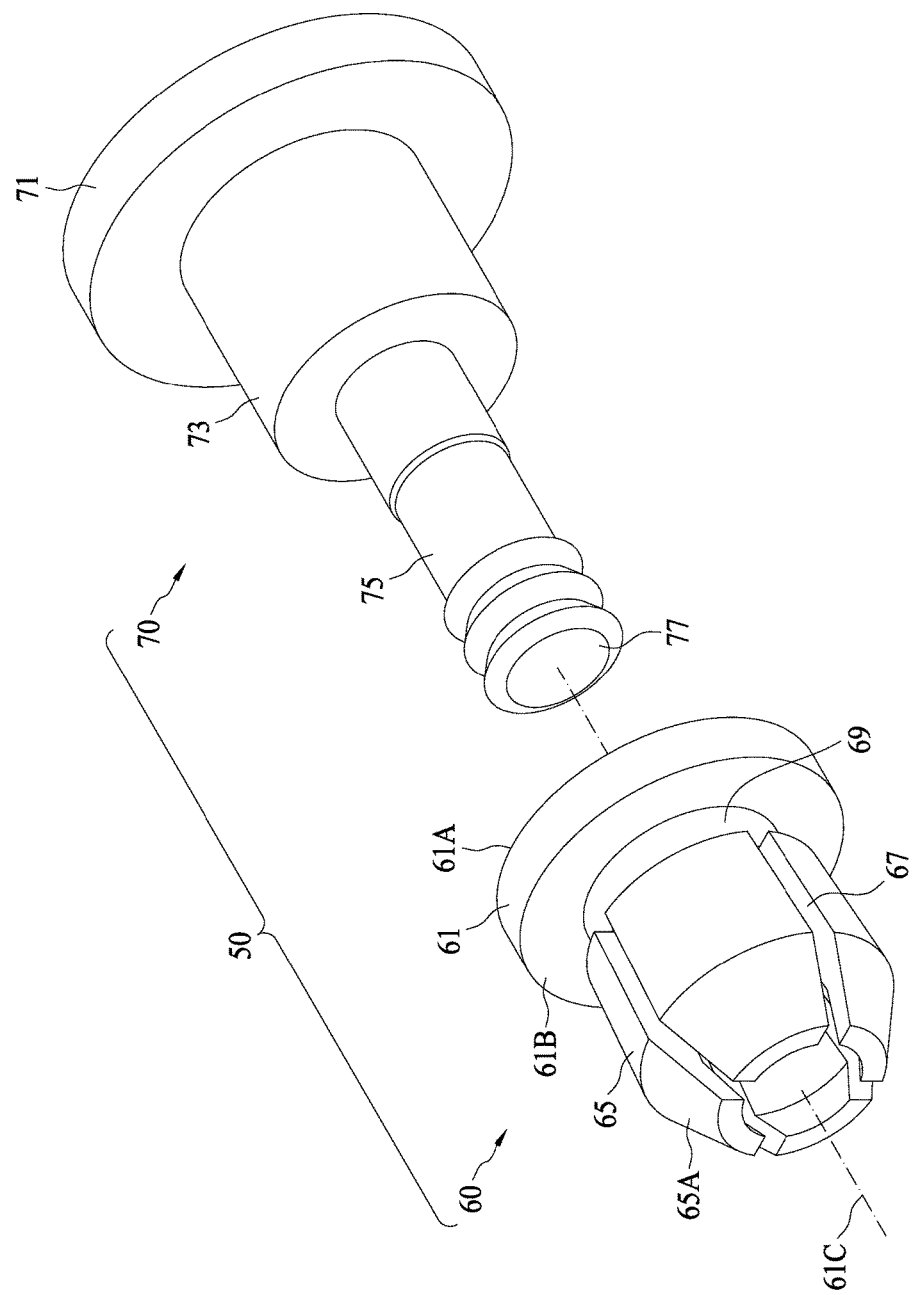
FIG. 3 and FIG. 4 are disassembled views of the board removal tool according to some embodiments of the present disclosure, wherein a portion of the at least one rivet of the board removal tool is removed for clarity in FIG. 4 according to some embodiments of the present disclosure.
Figure 4:
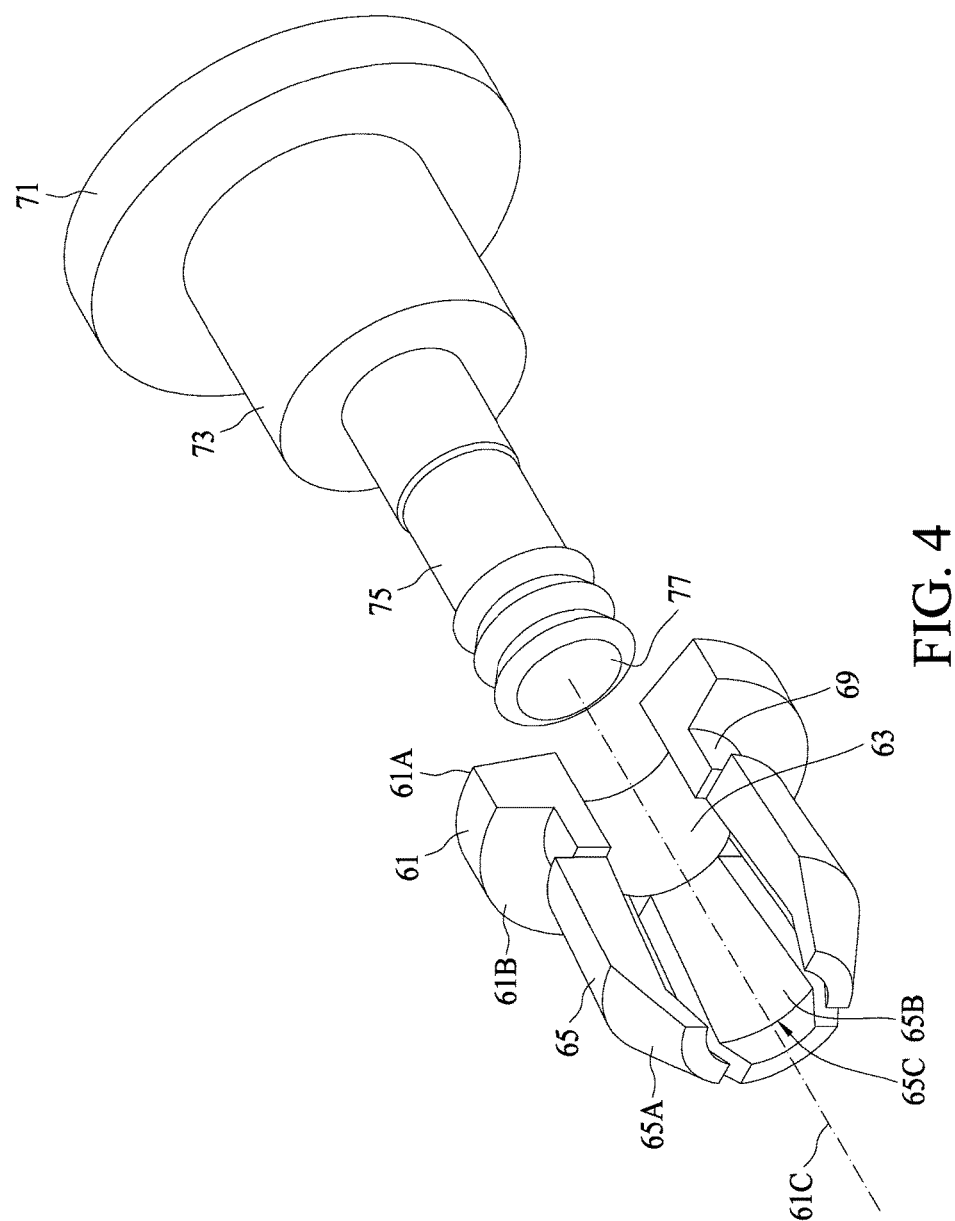

FIG. 3 and FIG. 4 are disassembled views of the board removal tool 50 according to some embodiments of the present disclosure, wherein a portion of the at least one rivet 60 of the board removal tool 50 is removed for clarity in FIG. 4 according to some embodiments of the present disclosure. In some embodiments of the present disclosure, the at least one rivet 60 of the board removal tool 50 has a head 61 with a proximal end 61A and a distal end 61B and a central axis 61C, wherein the head 60 has an internal passage 63 extending substantially parallel to the central axis 61C from the proximal end 61A to the distal end 61B of the head 61, and the distal end 61B of the head 61 is mechanically connected to at least two legs 65 extending distally from the head 61, wherein each of the at least two legs 65 has a tapering portion 65A and an internal surface 65B that faces the central axis 61C. The tapering portion 65A is designed to guide the insertion of the rivet 60 into the at least one opening 31.

In some embodiments of the present disclosure, there are gaps 67 between the at least two legs 65, and the at least two legs 65 can be forcibly pressed in a direction towards the central axis 61C, and the width between the outer surface of the at least two legs 65 shrinks so that the at least two legs 65 can pass through the at least one opening 31 and the at least one aperture 41. In some embodiments of the present disclosure, the internal surface 65B of the leg 65 has a corner 65C, wherein the internal passage 63 starts to shrink. In some embodiments of the present disclosure, the at least one pin 70 of the board removal tool 50 has a press portion 71, a wide pillar 73, a narrow pillar 75, and a front end 77. In some embodiments of the present disclosure, the at least one rivet 60 comprises a recessed portion 69 between the head 61 and the at least two legs 65.

Figure 5:
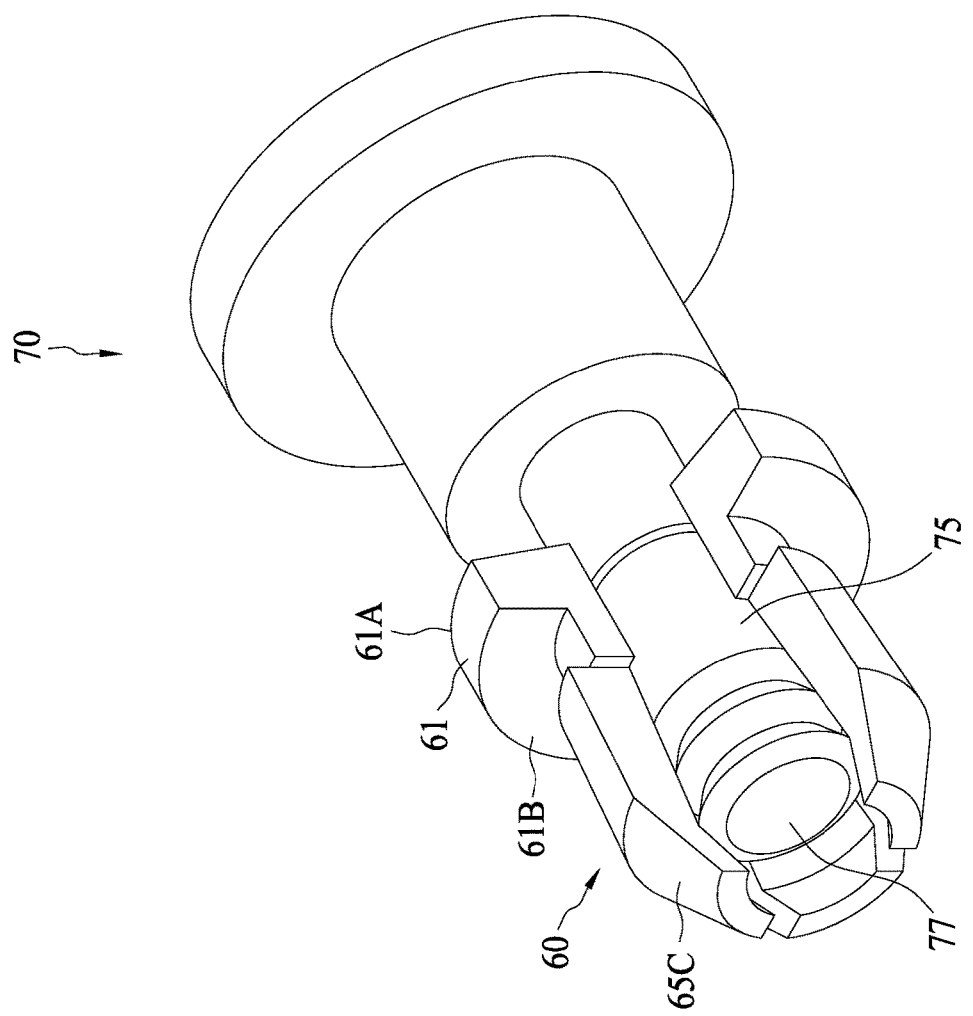
FIG. 5 and FIG. 6 are assembled views of the board removal tool according to some embodiments of the present disclosure, wherein the at least one pin of the board removal tool is partially inserted into the at least one rivet in FIG. 5, and the at least one pin of the board removal tool is completely inserted into the at least one rivet in FIG. 6 according to some embodiments of the present disclosure.
Figure 6:
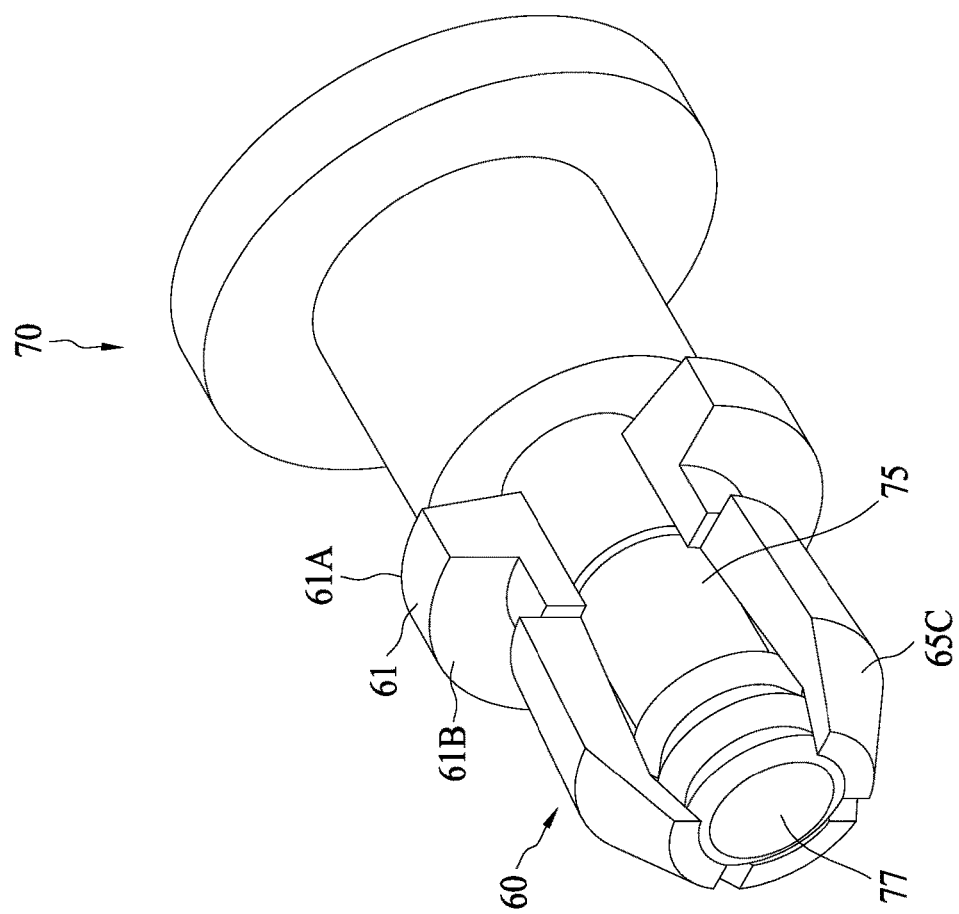

FIG. 5 and FIG. 6 are assembled views of the board removal tool 50 according to some embodiments of the present disclosure, wherein the at least one pin 70 of the board removal tool 50 is partially inserted into the at least one rivet 60 in FIG. 5, and the at least one pin 70 of the board removal tool 50 is completely inserted into the at least one rivet 60 in FIG. 6 according to some embodiments of the present disclosure. In some embodiments of the present disclosure, the at least one pin 70 is configured to be inserted into the internal passage 63 of the at least one rivet 60; as shown in FIG. 5, when the at least one pin 70 is moved in a direction from the proximal end 61A toward the distal end 61B of the at least one rivet 60, the front end 77 of the at least one pin 70 will contact the corner 65C of the at least two legs 65 to apply force to the internal surface 65B of the at least two legs 65 in a direction substantially perpendicular to the central axis 61C, i.e., forcibly expanding the at least two legs 65 in a direction substantially perpendicular to the central axis 61C, and the width of the at least two legs 65 expands. As the at least one pin 70 is further moved in a direction from the proximal end 61A towards the distal end 61B of the head 61 such that the at least one pin 70 is completely inserted into the at least one rivet 60 as shown in FIG. 6, the at least one pin 70 contacts the internal surface 65B of the tapering portion 65A of the at least two legs 65, and the at least two legs 65 are forcibly expanded and cannot be forcibly pressed in a direction towards the central axis 61C.

Figure 7:
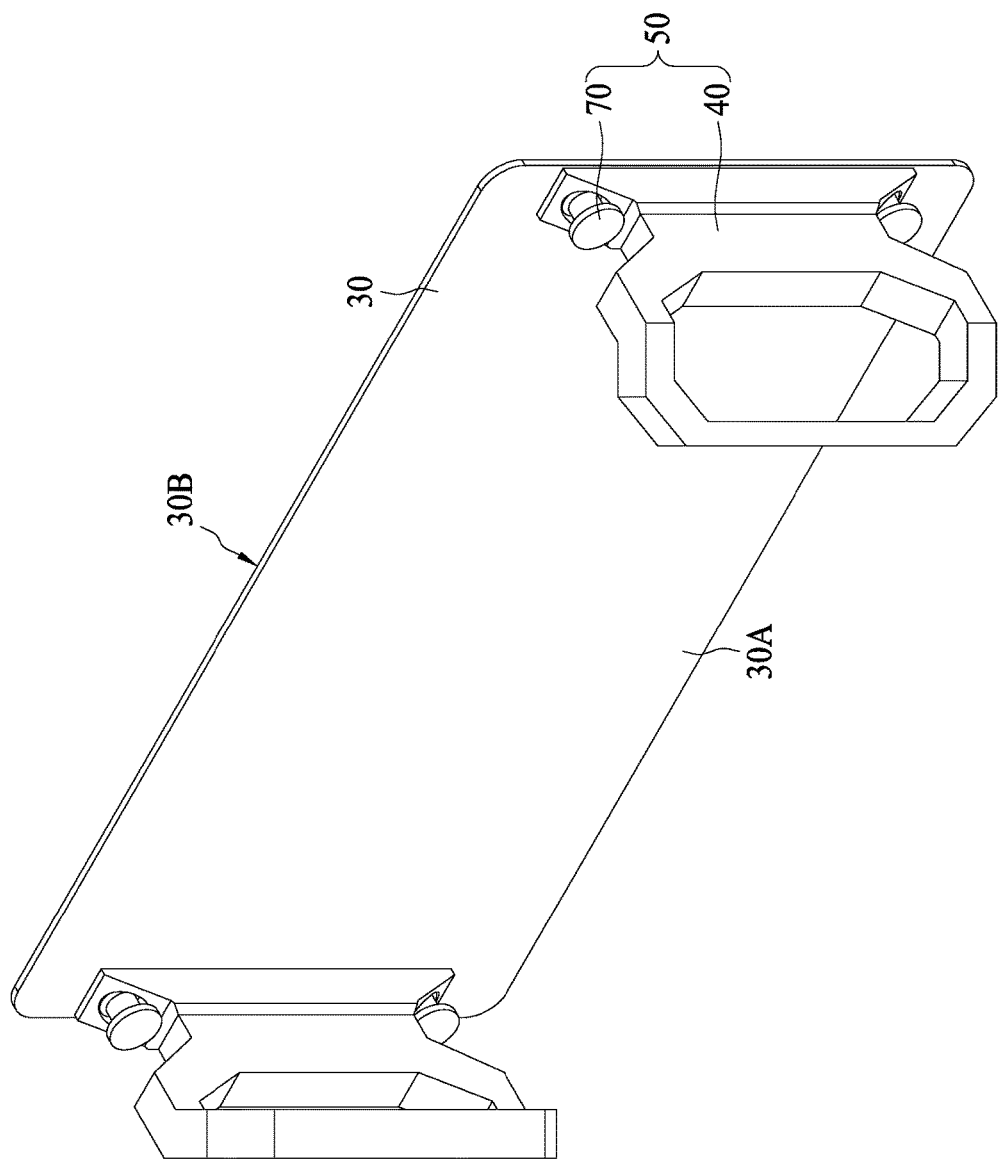
FIG. 7 is an assembled view of the circuit board and the board removal tool from a front side according to some embodiments of the present disclosure.
Figure 8:
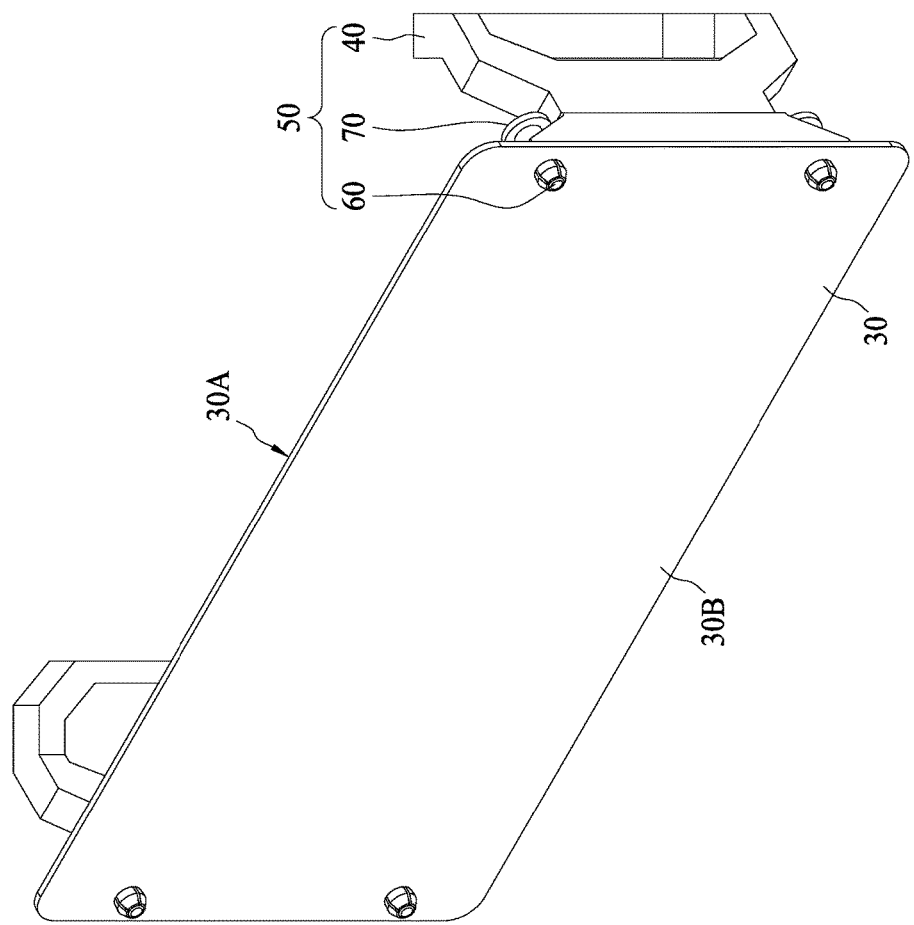
FIG. 8 is an assembled view of the circuit board and the board removal tool from a back side according to some embodiments of the present disclosure.
Figure 9:
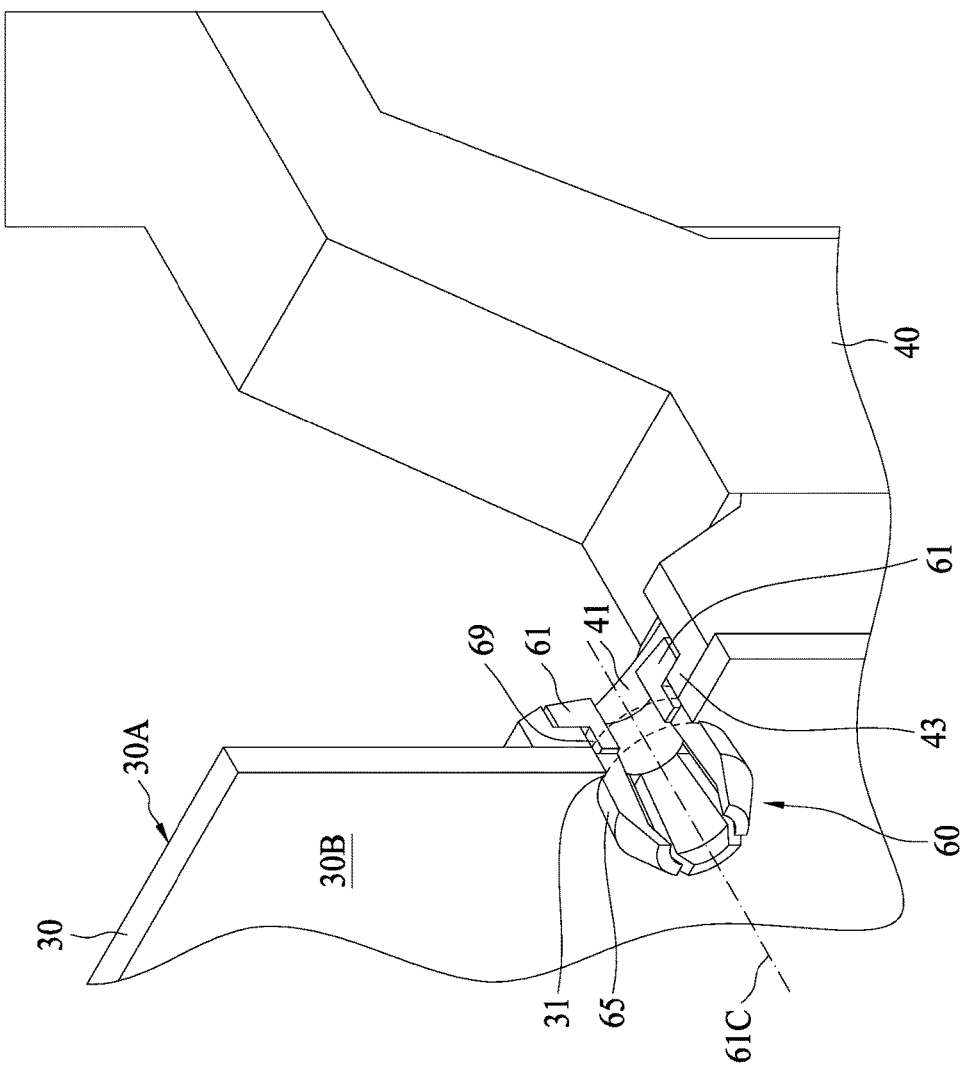
FIG. 9 is a close-up assembled view of the circuit board and the holding member by the at least one rivet of the board removal tool from the back side according to some embodiments of the present disclosure, wherein a portion of the circuit board and the at least one rivet are removed for clarity.
Figure 10:
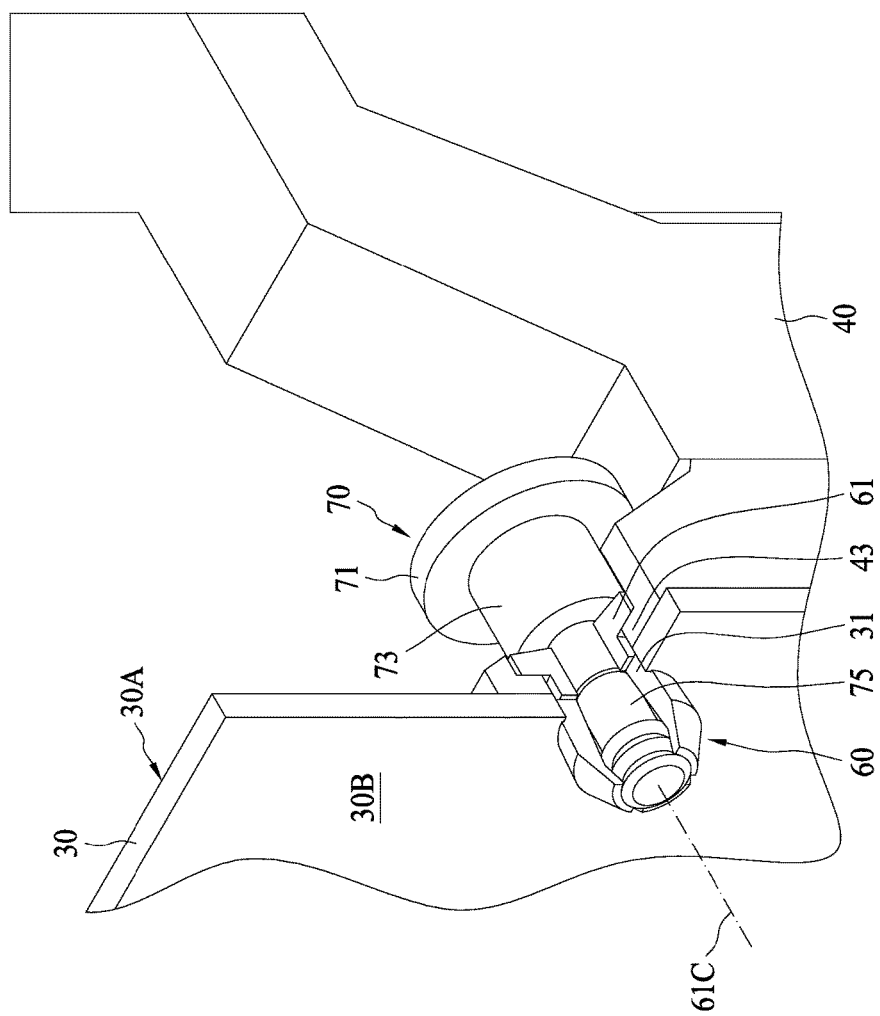
FIG. 10 is a close-up assembled view of the circuit board and the holding member by both the at least one rivet and the at least one pin of the board removal tool from the back side according to some embodiments of the present disclosure, wherein a portion of the circuit board and the at least one rivet are removed for clarity.

FIG. 7 is an assembled view of the circuit board 30 and the board removal tool 50 from a front side, and FIG. 8 is an assembled view of the circuit board 30 and the board removal tool 50 from a back side. FIG. 9 is a close-up assembled view of the circuit board 30 and the holding member 40 by the at least one rivet 60 of the board removal tool 50 from the back side, wherein a portion of the circuit board 30 and the at least one rivet 60 are removed for clarity, and FIG. 10 is a close-up assembled view of the circuit board 30 and the holding member 40 by both the at least one rivet 60 and the at least one pin 70 of the board removal tool 50 from the back side, wherein a portion of the circuit board 30 and the at least one rivet 60 are removed for clarity.

In some embodiments of the present disclosure, the at least one rivet 60 is inserted both in the at least one opening 31 of the circuit board 30 and the at least one aperture 41 of the holding member 40, wherein the holding member 40 comprises a washer portion 43 in the at least one aperture 41, and the washer portion 43 is disposed in the recessed portion 69. In some embodiments of the present disclosure, the washer portion 43 has an opening, and the width of the opening is smaller than the width of the head 61 of the rivet 60 and the wide pillar 73 of the pin 70.

In some embodiments of the present disclosure, after the at least one pin 70 is inserted into the internal passage 63 of the at least one rivet 60, the narrow pillar 75 of the at least one pin 70 contacts the internal surface 65B of the at least two legs 65 to forcibly expand the at least two legs 65 in a direction substantially perpendicular to the central axis 61C, and the width of the at least two legs 65 expands to be larger than the width of at least one opening 31 of the circuit board 30. Consequently, the at least two legs 65 of the at least one rivet 60 are blocked by the circuit board 30 from passing through the at least one opening 31 of the circuit board 30 and the at least one aperture 41 of the holding member 40. As a result, the holding member 40 can apply a force along a direction from the second surface 30B to the first surface 30A of the circuit board 30 so as to implement the removal of the circuit board 30 from the housing 20.

Figure 11:
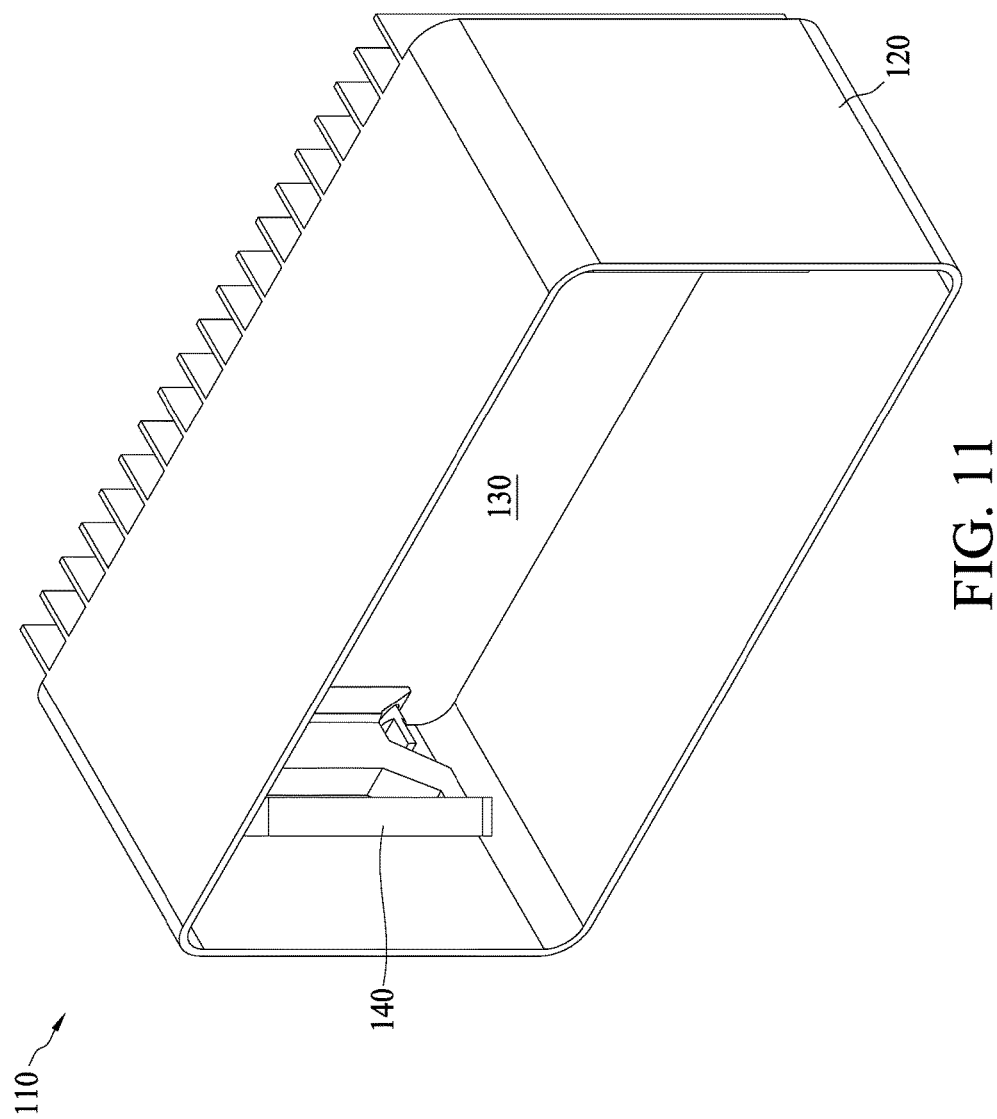
FIG. 11 is an assembled view of a circuit board housing assembly according to some embodiments of the present disclosure.
Figure 12:
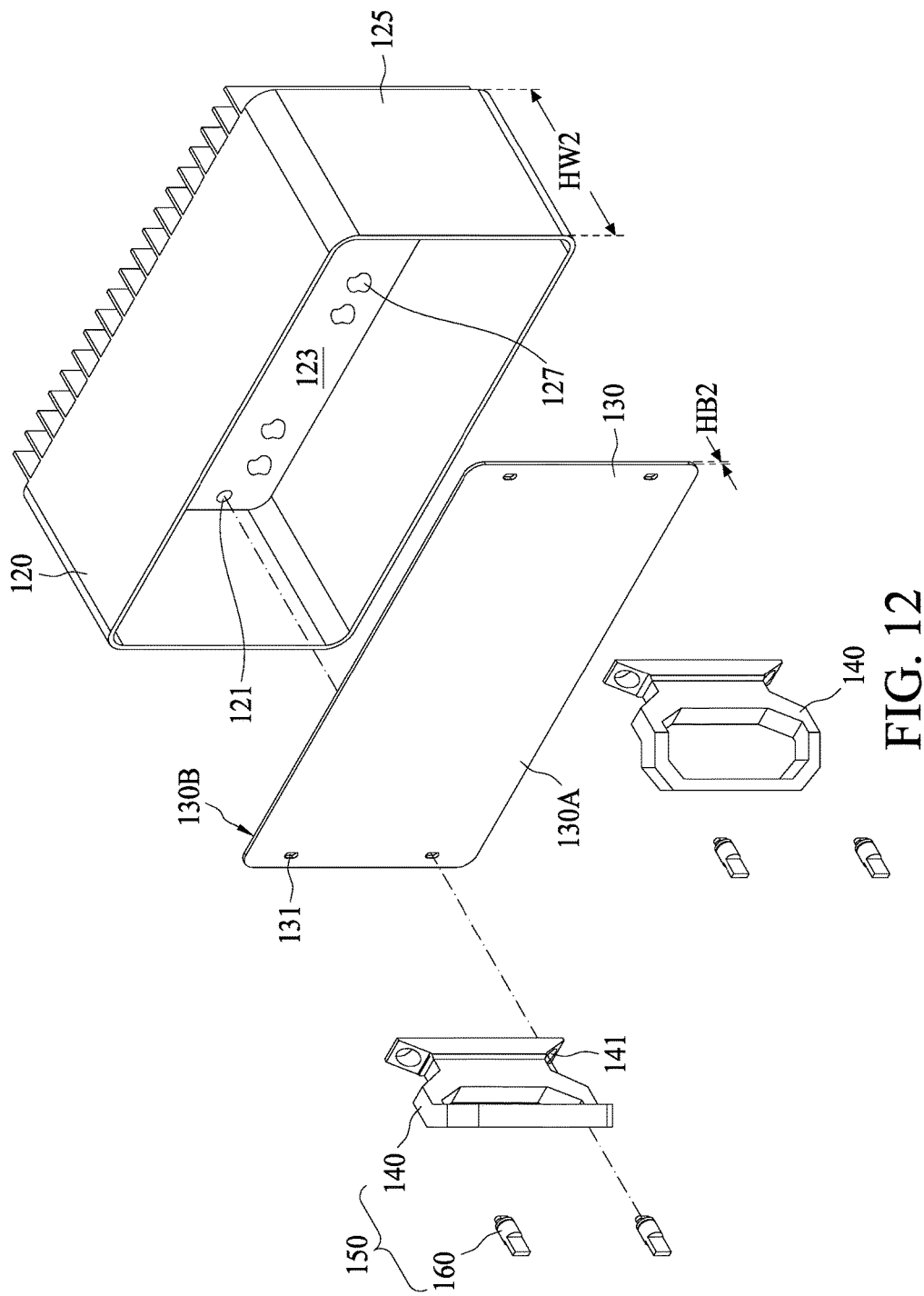
FIG. 12 is a disassembled view of the circuit board housing assembly in FIG. 11 according to some embodiments of the present disclosure.

FIG. 11 is an assembled view of a circuit board housing assembly 110 according to some embodiments of the present disclosure, and FIG. 12 is a disassembled view of the circuit board housing assembly 110 in FIG. 11 according to some embodiments of the present disclosure. In some embodiments of the present disclosure, the circuit board housing assembly 110 comprises a housing 120 including at least one screw hole 121, a circuit board 130 attached to the housing 120, wherein the circuit board 130 includes at least one opening 131 corresponding to the at least one screw hole 121; and a board removal tool 150 comprising a holding member 140 including at least one pin 160. In some embodiments of the present disclosure, the circuit board housing assembly 110 may further comprises a cover (not shown in the drawing) configured for covering the housing 120 so as to isolate the interior of the housing 120 from the external environment.

In some embodiments of the present disclosure, the housing 120 includes a base 123 and a wall 125 disposed on the base 123, and a height (HB2) of the circuit board 130 is smaller than a height (HW2) of the wall 125. In some embodiments of the present disclosure, the circuit board 130 includes a first surface (front surface) 130A and a second surface (back surface) 130B, wherein the second surface 130B faces the base 123 of the housing 120, and the holding member 140 is positioned on the first surface 130A. In some embodiments of the present disclosure, the circuit board 130 is attached to the base 123 of the housing 120 by a bonding material 127, including but not limited to adhesive and thermal gel.

In some embodiments of the present disclosure, the circuit board 130 is assembled to the housing 120 with the bonding material 127 in a compact manner, i.e., a gap between the wall 125 of the housing 120 and an edge of the circuit board 130 is too small for inserting a board-removing tool through the small gap or the edge of the circuit board 130. Consequently, the height (HW2) of the wall 125 and the small gap between the wall 125 and the circuit board 130 prevent a board-removing tool from inserting into the second surface 130B through the small gap or the edge of the circuit board 130.

In some embodiments of the present disclosure, the holding member 140 has at least one aperture 141 corresponding to the at least one opening 131 of the circuit board 130, and the at least one pin 160 is disposed in the at least one opening 131 and the at least one aperture 141. In some embodiments of the present disclosure, the at least one screw hole 121, the at least one opening 131, the at least one aperture 141, and the at least one pin 160 are designed to be aligned with each other.

In some embodiments of the present disclosure, the circuit board 130 is a multi-layer printed circuit board (multi-layer PCB) comprising a plurality of dielectric layers and metal layers, with electronic components. For example, such electronic components might include, but are not limited to, rectifiers for a power supply, high-power transistors, high-power attenuators, processors, and memories. In some embodiments of the present disclosure, the circuit board housing assembly 110 can be considered an electronics system.

Figure 13:
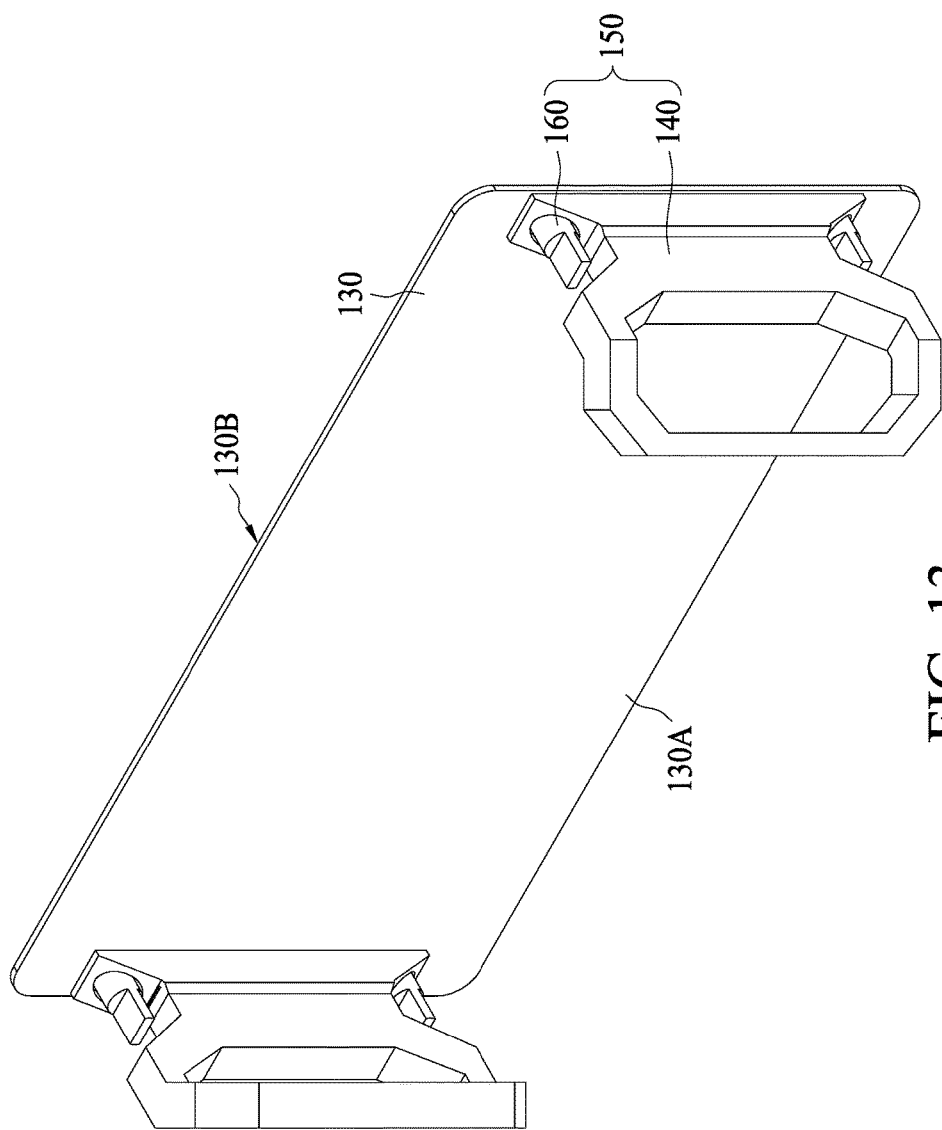
FIG. 13 is an assembled view of the circuit board and the board removal tool from a front side according to some embodiments of the present disclosure.
Figure 14:
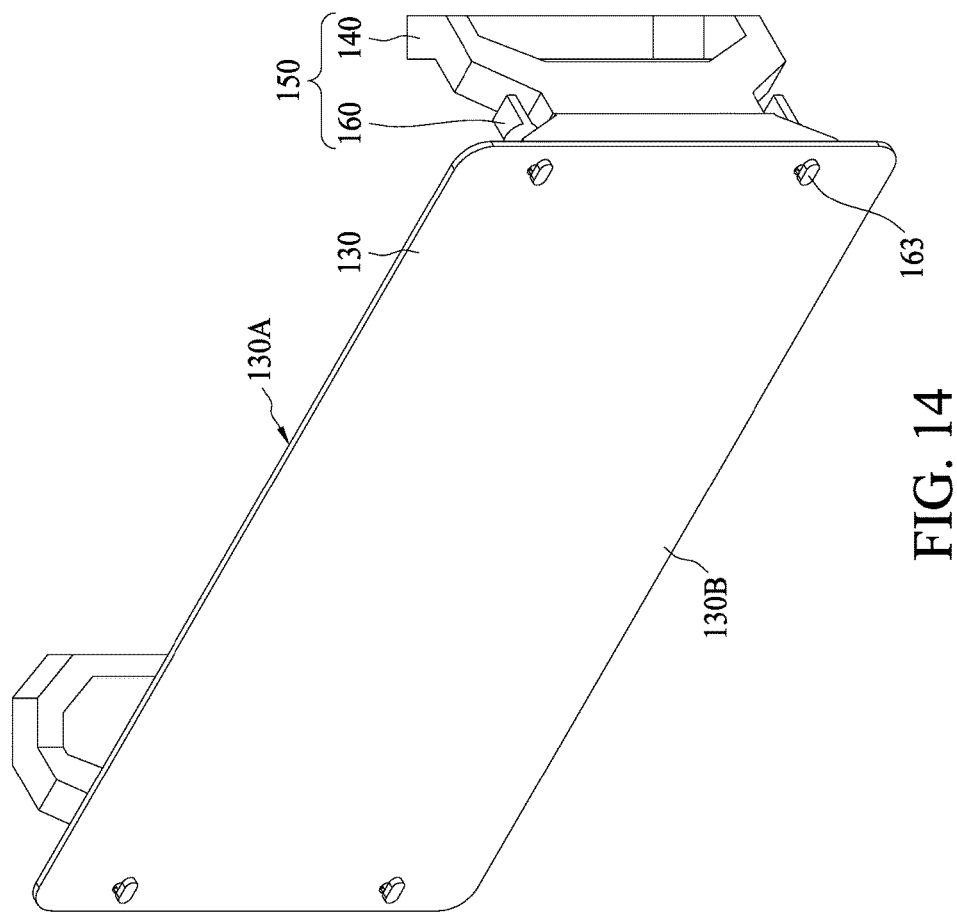
FIG. 14 is an assembled view of the circuit board and the board removal tool from a back side according to some embodiments of the present disclosure.
Figure 15:
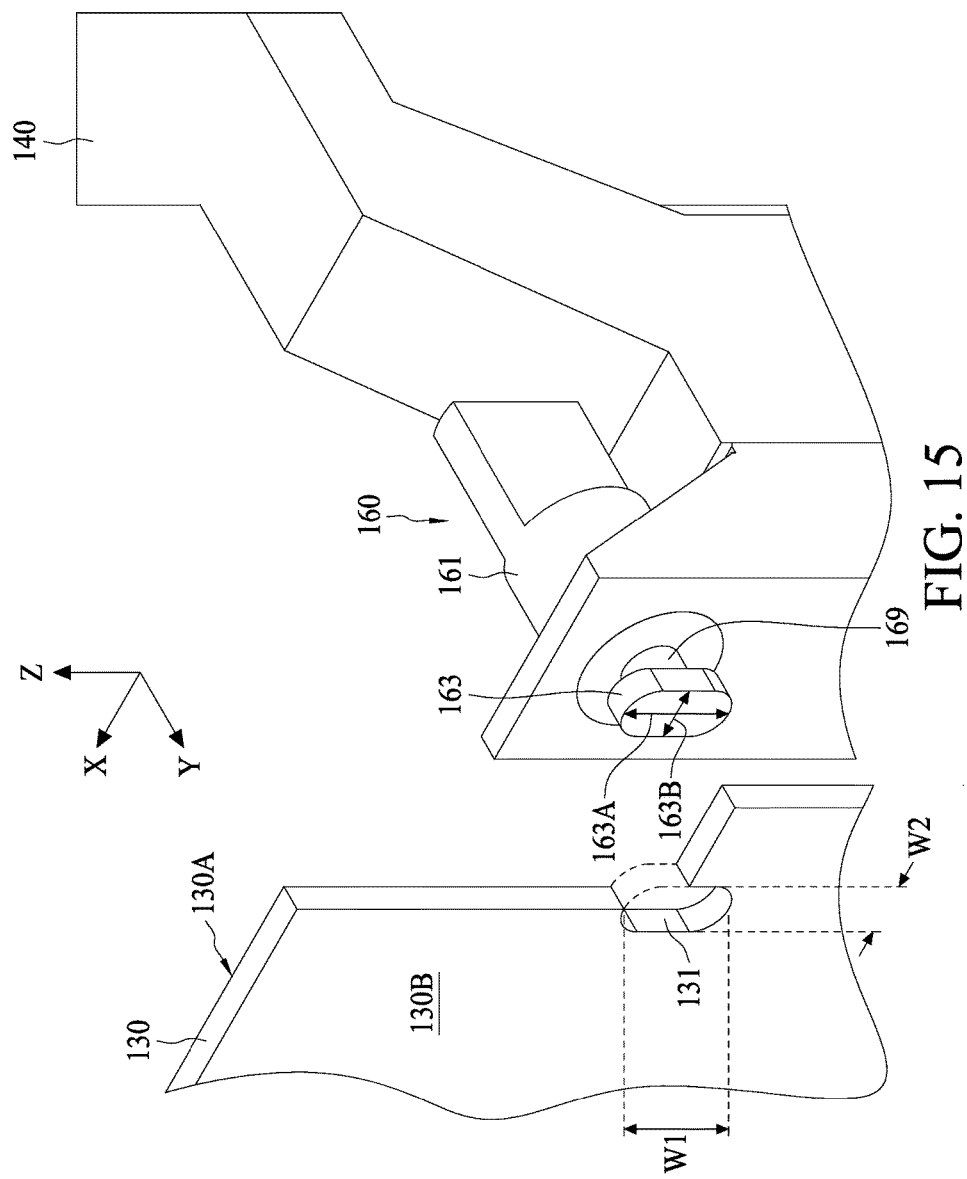
FIG. 15 is a close-up disassembled view of the circuit board and the board removal tool from the back side according to some embodiments of the present disclosure, wherein a portion of the circuit board is removed for clarity.
Figure 16:
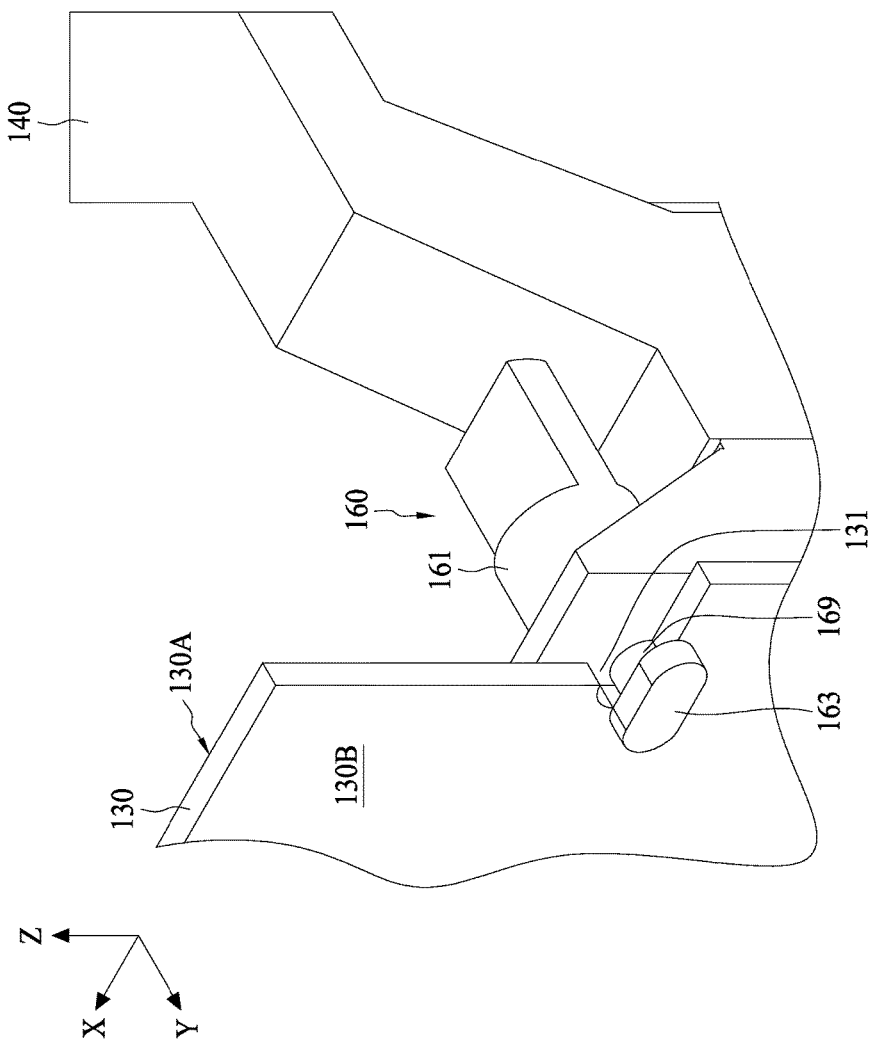
FIG. 16 is a close-up assembled view of the circuit board and the board removal tool from the back side according to some embodiments of the present disclosure, wherein a portion of the circuit board is removed for clarity.

FIG. 13 is an assembled view of the circuit board 130 and the board removal tool 150 from a front side, and FIG. 14 is an assembled view of the circuit board 130 and the board removal tool 150 from a back side. FIG. 15 is a close-up disassembled view of the circuit board 130 and the board removal tool 150 from the back side, wherein a portion of the circuit board 130 is removed for clarity, and FIG. 16 is a close-up assembled view of the circuit board 130 and the board removal tool 150 from the back side, wherein a portion of the circuit board 130 is removed for clarity.

In some embodiments of the present disclosure, the at least one opening 131 of the circuit board 130 has a first opening width (W1) along a first direction and a second opening width (W2) along a second direction, and the second opening width (W2) is smaller than the first opening width (W1). In some embodiments of the present disclosure, the at least one opening 131 is elliptical, and the first direction is substantially perpendicular to the second direction. In some embodiments of the present disclosure, the first direction is Z-direction, and the second direction is X-direction.

In some embodiments of the present disclosure, the at least one pin 160 has a recessed portion 169 between a head 161 and a flange 163, wherein the flange 163 has a first axis 163A and a second axis 163B and the second axis 163B is smaller than the first axis 163A. In some embodiments of the present disclosure, the flange 163 is elliptical, and the first axis 163A is substantially perpendicular to the second axis 163B. In some embodiments of the present disclosure, the width of the recessed portion 169 is smaller than the width of the second opening width (W2) of the at least one opening 131.

In some embodiments of the present disclosure, after the flange 163 of the at least one pin 160 is inserted into the at least one opening 131 along an insertion direction (for example, the Y-direction) in a manner of the first axis 163A being aligned with the first direction, the at least one pin 160 is then rotated such that the first axis 163A is not aligned with the first direction. In some embodiments of the present disclosure, the at least one pin 160 is rotated such that the first axis 163A is aligned with the second direction, as shown in FIG. 16. In some embodiments of the present disclosure, after the flange 163 of the at least one pin 160 is inserted into the at least one opening 131, the circuit board 130 is positioned in the recessed portion 169 of the at least one pin 160.

Consequently, the flange 163 is blocked by the circuit board 130 from passing through the at least one opening 131 of the circuit board 130. As a result, the holding member 140 can apply a force along a direction from the second surface 130B to the first surface 130A of the circuit board 130 so as to implement the removal of the circuit board 130 from the housing 120.

Figure 17:
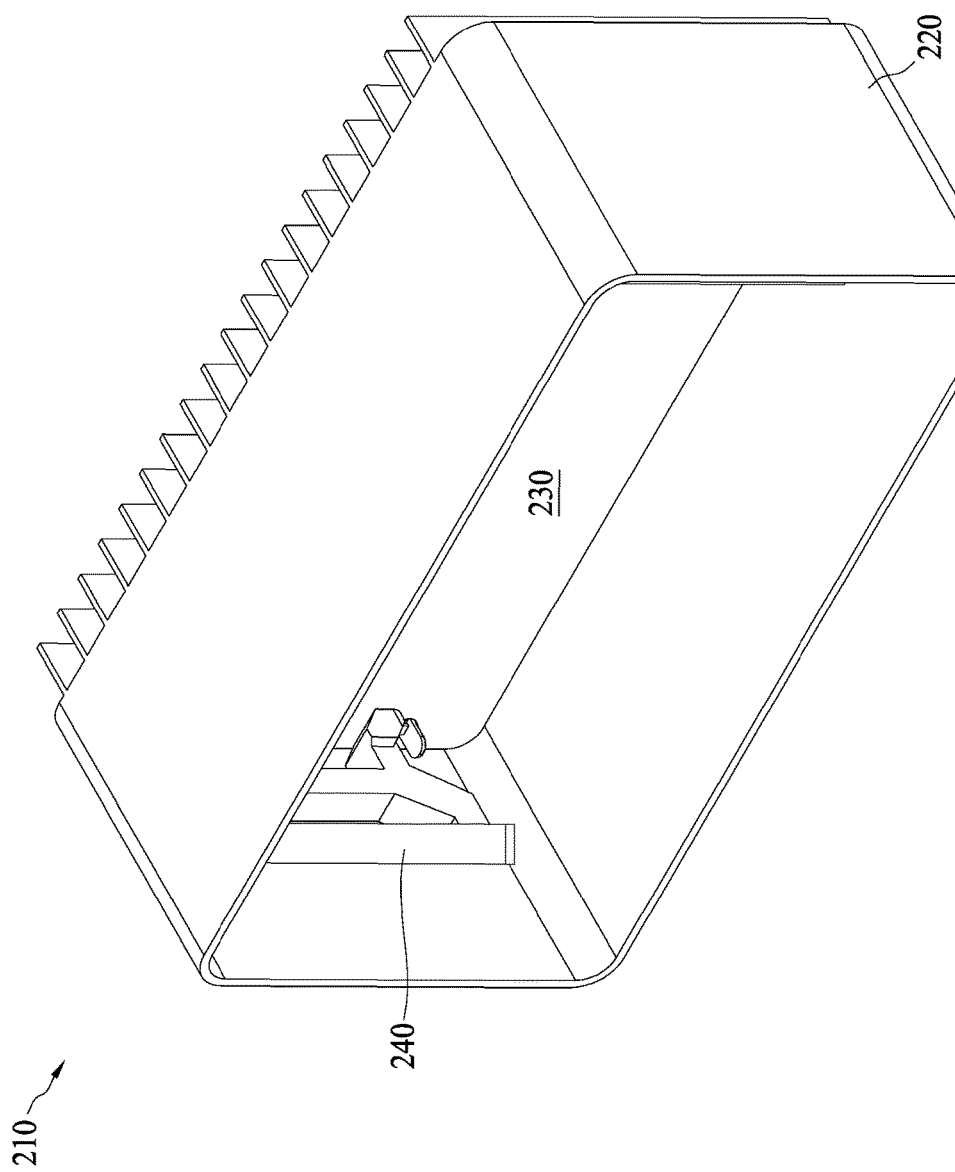
FIG. 17 is an assembled view of a circuit board housing assembly according to some embodiments of the present disclosure.
Figure 18:
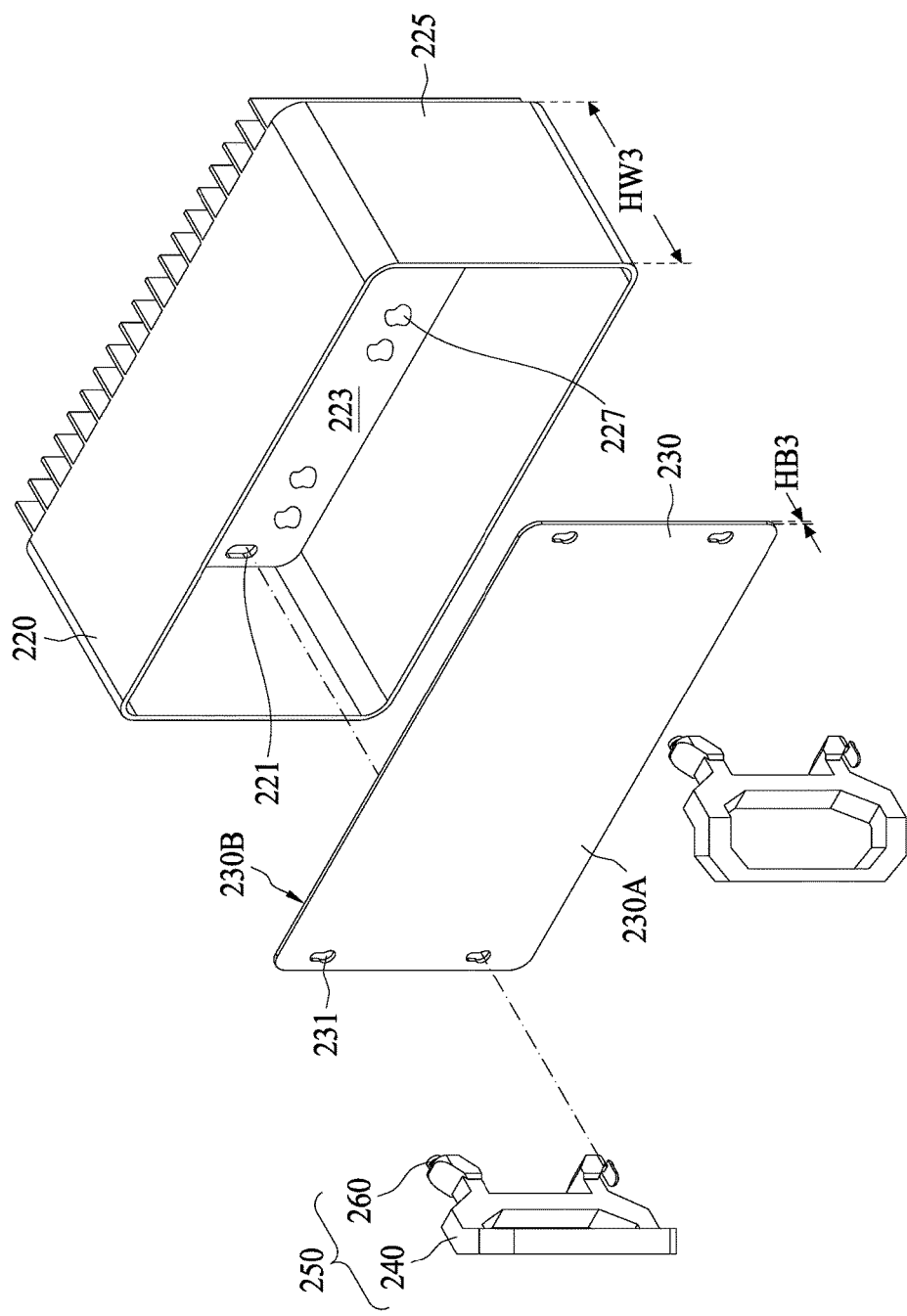
FIG. 18 is a disassembled view of the circuit board housing assembly in FIG. 17 according to some embodiments of the present disclosure.

FIG. 17 is an assembled view of a circuit board housing assembly 210 according to some embodiments of the present disclosure, and FIG. 18 is a disassembled view of the circuit board housing assembly 210 in FIG. 17 according to some embodiments of the present disclosure. In some embodiments of the present disclosure, the circuit board housing assembly 210 comprises a housing 220 including at least one screw hole 221, a circuit board 230 attached to the housing 220, wherein the circuit board 230 includes at least one opening 231 corresponding to the at least one screw hole 221; and a board removal tool 250 comprising a holding member 240 including at least one pin 260. In some embodiments of the present disclosure, the at least one screw hole 221, the at least one opening 231, and the at least one pin 260 are designed to be aligned with each other. In some embodiments of the present disclosure, the circuit board housing assembly 210 may further comprises a cover (not shown in the drawing) configured for covering the housing 220 so as to isolate the interior of the housing 220 from the external environment.

In some embodiments of the present disclosure, the housing 220 includes a base 223 and a wall 225 disposed on the base 223, and a height (HB3) of the circuit board 230 is smaller than a height (HW3) of the wall 225. In some embodiments of the present disclosure, the circuit board 230 includes a first surface (front surface) 230A and a second surface (back surface) 230B, wherein the second surface 230B faces the base 223 of the housing 220, and the holding member 240 is positioned on the first surface 230A. In some embodiments of the present disclosure, the circuit board 230 is attached to the base 223 of the housing 220 by a bonding material 227, including but not limited to adhesive and thermal gel.

In some embodiments of the present disclosure, the circuit board 230 is assembled to the housing 220 with the bonding material 227 in a compact manner, i.e., a gap between the wall 225 of the housing 220 and an edge of the circuit board 230 is too small for inserting a board-removing tool through the small gap or the edge of the circuit board 230. Consequently, the height (HW3) of the wall 225 and the small gap between the wall 225 and the circuit board 230 prevent a board-removing tool from inserting into the second surface 230B through the small gap or the edge of the circuit board 230.

In some embodiments of the present disclosure, the holding member 240 and the at least one pin 260 are integrally formed by the same material, and the at least one pin 260 is disposed in the at least one opening 231 of the circuit board 230 when the holding member 240 is positioned on the first surface 230A.

In some embodiments of the present disclosure, the circuit board 230 is a multi-layer printed circuit board (multi-layer PCB) comprising a plurality of dielectric layers and metal layers, with electronic components. For example, such electronic components might include, but are not limited to, rectifiers for a power supply, high-power transistors, high-power attenuators, processors, and memories. In some embodiments of the present disclosure, the circuit board housing assembly 210 can be considered an electronics system.

Figure 19:
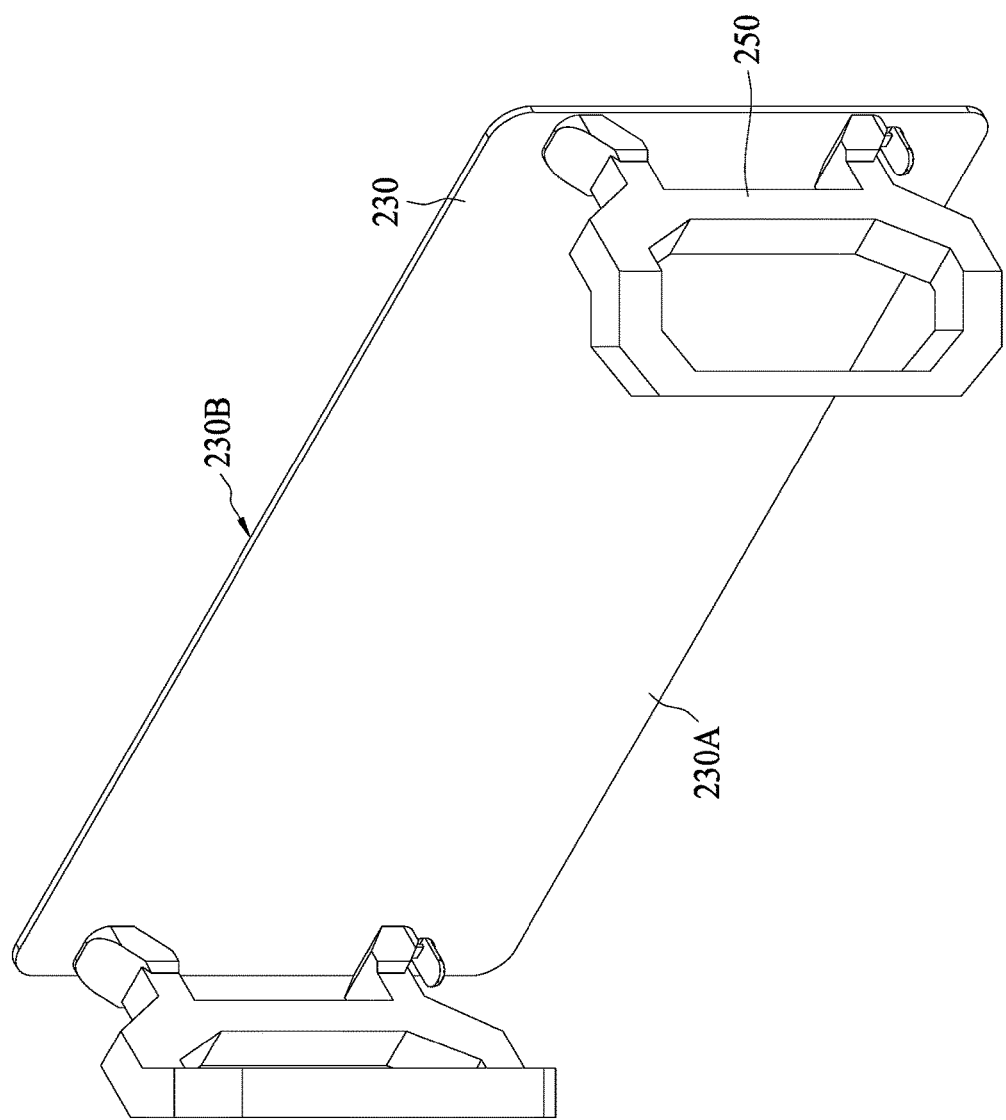
FIG. 19 is an assembled view of the circuit board and the board removal tool from a front side according to some embodiments of the present disclosure.
Figure 20:
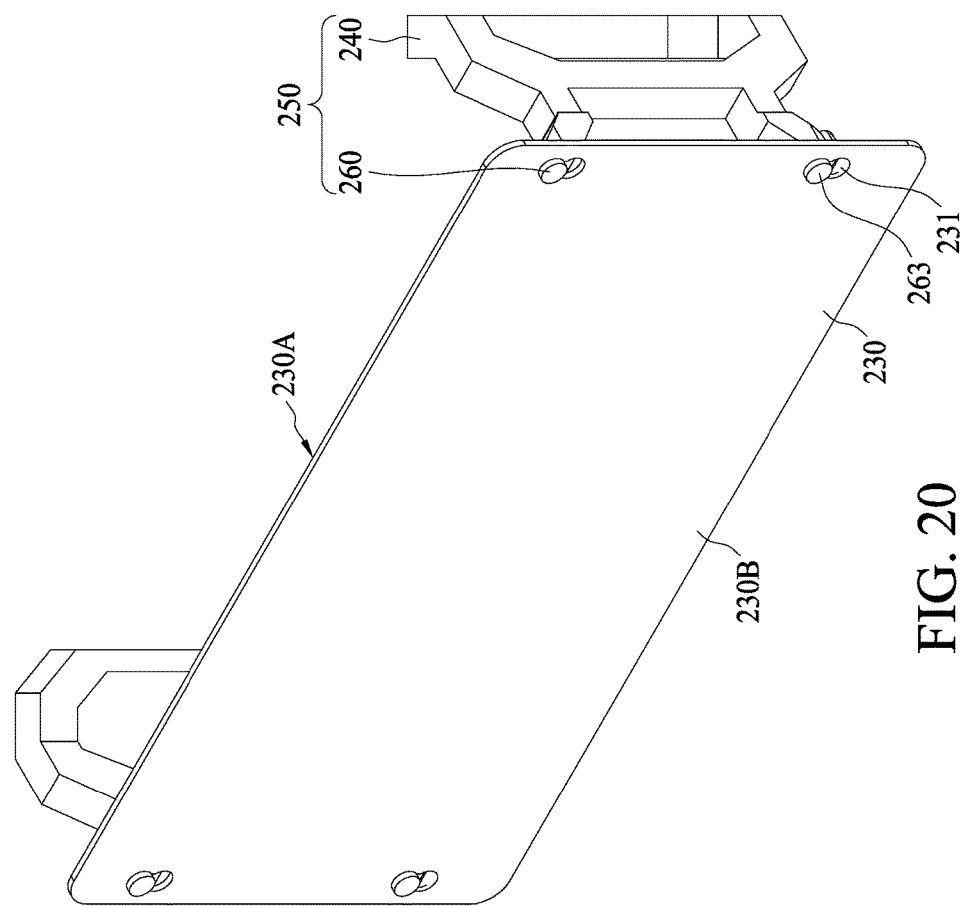
FIG. 20 is an assembled view of the circuit board and the board removal tool from a back side according to some embodiments of the present disclosure.
Figure 21:
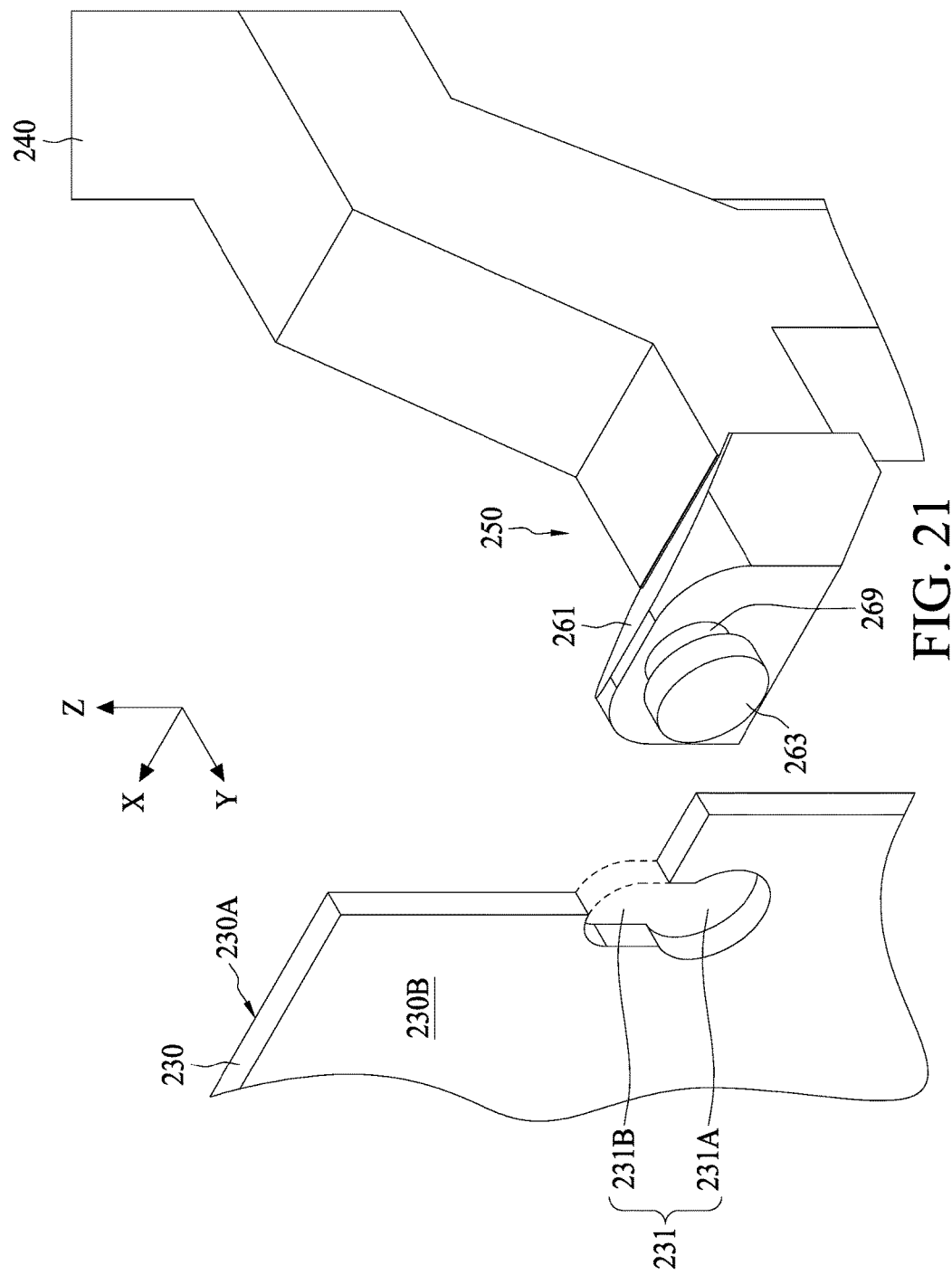
FIG. 21 is a close-up disassembled view of the circuit board and the board removal tool from the back side according to some embodiments of the present disclosure, wherein a portion of the circuit board is removed for clarity.
Figure 22:
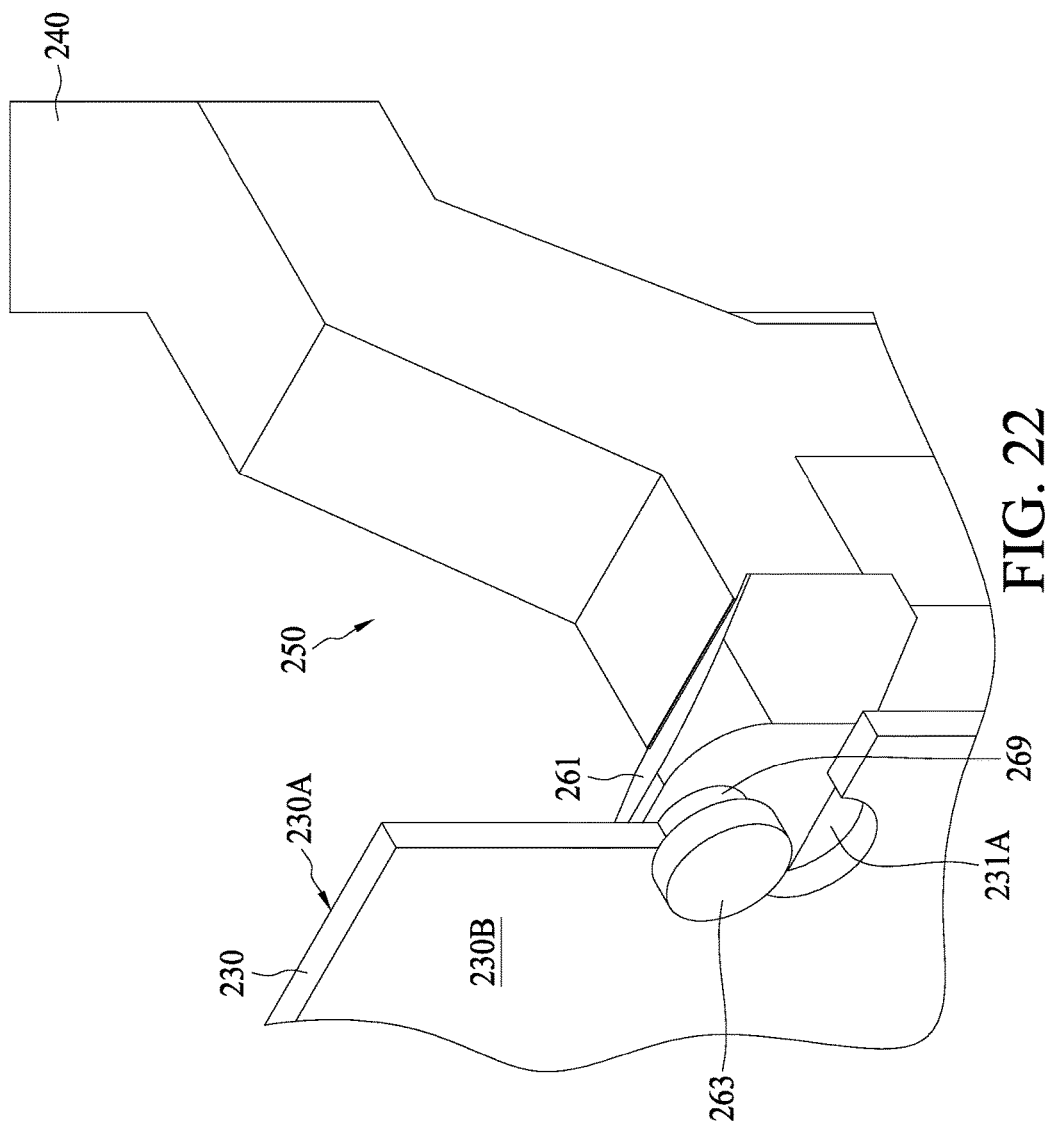
FIG. 22 is a close-up assembled view of the circuit board and the board removal tool from the back side according to some embodiments of the present disclosure, wherein a portion of the circuit board is removed for clarity.

FIG. 19 is an assembled view of the circuit board 230 and the board removal tool 250 from a front side, and FIG. 20 is an assembled view of the circuit board 230 and the board removal tool 250 from a back side. FIG. 21 is a close-up disassembled view of the circuit board 230 and the board removal tool 250 from the back side, wherein a portion of the circuit board 230 is removed for clarity, and FIG. 22 is a close-up assembled view of the circuit board 230 and the board removal tool 250 from the back side, wherein a portion of the circuit board 230 is removed for clarity.

In some embodiments of the present disclosure, the at least one opening 231 of the circuit board 230 has a wide portion 231A and a narrow portion 231B along an extension direction, and the width of the narrow portion 231B is smaller than that of the wide portion 231A. In some embodiments of the present disclosure, the at least one pin 260 is inserted into the at least one opening 231 of the circuit board 230 along an insertion direction, and the extension direction is substantially perpendicular to the insertion direction. In some embodiments of the present disclosure, the extension direction is Z-direction, and the insertion direction is Y-direction. In some embodiments of the present disclosure, the width of the recessed portion 269 is smaller than the width of the narrow portion 231B of the at least one opening 131, and the width of the flange 263 is larger than the width of the narrow portion 231B of the at least one opening 131.

In some embodiments of the present disclosure, the at least one pin 260 has a recessed portion 269 between a head 261 and a flange 263. In some embodiments of the present disclosure, after the flange 263 of the at least one pin 260 is inserted into the at least one opening 231 through the wide portion 231A along the insertion direction, the at least one pin 260 is laterally moved (for example, moving upwards along the Z-direction) such that the recessed portion 269 is positioned in the narrow portion 231B, as shown in FIG. 22. In some embodiments of the present disclosure, after the flange 263 of the at least one pin 260 is inserted into the at least one opening 231, the circuit board 230 is positioned in the recessed portion 269 of the at least one pin 260.

Consequently, the flange 263 is blocked by the circuit board 230 from passing through the at least one opening 231 of the circuit board 230. As a result, the holding member 240 can apply a force along a direction from the second surface 230B to the first surface 230A of the circuit board 230 so as to implement the removal of the circuit board 230 from the housing 220.

In some embodiments of the present disclosure, a circuit board housing assembly includes a housing; a circuit board attached to the housing, wherein the circuit board includes at least one opening; and a board removal tool including a holding member, at least one rivet and at least one pin. In some embodiments of the present disclosure, the holding member has at least one aperture corresponding to the at least one opening of the circuit board; the at least one rivet is inserted in the at least one opening and the at least one aperture, the at least one rivet has a head with a proximal end and a distal end and a central axis, the head has an internal passage extending substantially parallel to the central axis from the proximal end to the distal end of the head, and the distal end of the head is mechanically connected to at least two legs extending distally from the head and having an internal surface that faces the central axis; and when the at least one pin is inserted into the internal passage along a direction from the proximal end towards the distal end of the head of the at least one rivet, the at least one pin contacts the internal surface of the at least two legs to apply force on the at least two legs in a direction substantially perpendicular to the central axis.

In some embodiments of the present disclosure, a circuit board housing assembly includes a housing; a circuit board attached to the housing, wherein the circuit board includes at least one opening having a first opening width along a first direction and a second opening width along a second direction, and the second opening width is smaller than the first opening width; and a board removal tool including a holding member including at least one pin having a recessed portion between a head and a flange, the flange having a first axis along a first direction and a second axis along a second direction, the second axis being smaller than the first axis, wherein after the flange of the at least one pin is inserted into the at least one opening in a manner of the first axis being aligned with the first direction, the at least one pin is rotated such that the first axis is not aligned with the first direction.

In some embodiments of the present disclosure, a circuit board housing assembly includes a housing; a circuit board attached to the housing, wherein the circuit board includes at least one opening having a wide portion and a narrow portion; and a board removal tool comprising a holding member including at least one pin having a recessed portion between a head and a flange, wherein after the flange of the at least one pin is inserted into the wide portion of the at least one opening, the at least one pin is laterally moved such that the recessed portion is positioned in the narrow portion.

From time to time, the removal of the printed circuit board from the housing is required to accomplish various functions. In case the circuit board is assembled to the housing with a bonding material in a compact manner, i.e., a gap between the wall of the housing and an edge of the circuit board is too small for inserting a board-removing tool through the small gap or the edge of the circuit board. Consequently, the height of the wall and the small gap between the wall and the circuit board prevent a board-removing tool from inserting into the second surface through the small gap or the edge of the circuit board.

The present disclosure provides a circuit board housing assembly with a board removal tool for removing the circuit board from the housing, in the absence of using a tool configured for inserting into the second surface of the circuit board from the edge of the circuit board or the gap between the circuit board and the housing. In some embodiments of the present disclosure, the board removal tool may use an opening of the circuit board, wherein the opening may be designed for fastening the circuit board onto the base of the housing by a bolt. In some embodiments of the present disclosure, the board removal tool may use a newly designed opening on the circuit board. In some embodiments of the present disclosure, some parts of the board removal tool are inserted into the opening, and the parts are forcibly expanded such that the parts are blocked by the circuit board from passing through the at least one opening of the circuit board. In some embodiments of the present disclosure, some parts of the board removal tool are inserted into the opening, and the parts are either rotated or laterally moved such that the parts of the board removal tool are blocked by the circuit board.

Consequently, the parts of the board removal tool are blocked by the circuit board from passing through the at least one opening of the circuit board. As a result, the board removal tool can apply a force along a direction from the second surface to the first surface of the circuit board so as to implement the removal of the circuit board from the housing, in the absence of using a tool configured for inserting into the second surface of the circuit board from the edge of the circuit board or the gap between the circuit board and the housing.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A circuit board housing assembly, comprising:
   a housing;
   a circuit board attached to the housing, wherein the circuit board includes at least one opening; and
   a board removal tool comprising a holding member, at least one rivet and at least one pin;
   wherein the holding member has at least one aperture corresponding to the at least one opening of the circuit board;
   wherein the at least one rivet is inserted in the at least one opening and the at least one aperture, the at least one rivet has a head with a proximal end and a distal end and a central axis, the head has an internal passage extending substantially parallel to the central axis from the proximal end to the distal end of the head, and the distal end of the head is mechanically connected to at least two legs extending distally from the head and having an internal surface that faces the central axis; and
   wherein when the at least one pin is inserted into the internal passage along a direction from the proximal end towards the distal end of the head of the at least one rivet, the at least one pin contacts the internal surface of the at least two legs to apply force on the at least two legs in a direction substantially perpendicular to the central axis.

2. The circuit board housing assembly of claim 1, wherein the housing includes a base and a wall disposed on the base, and a height of the circuit board is smaller than a height of the wall.

3. The circuit board housing assembly of claim 2, wherein the circuit board includes a first surface and a second surface, the holding member is positioned on the first surface, and the second surface faces the base of the housing.

4. The circuit board housing assembly of claim 3, wherein after the at least one pin contacts the internal surface of the at least two legs to forcibly expand the at least two legs in a direction substantially perpendicular to the central axis, the at least two legs of the at least one rivet are blocked by the circuit board from passing through the at least one opening of the circuit board.

5. The circuit board housing assembly of claim 3, wherein when the at least one pin is moved into the internal passage, the at least two legs are forcibly expanded in a direction substantially perpendicular to the central axis, and the at least two legs of the at least one rivet are blocked by the circuit board from passing through the at least one opening of the circuit board.

6. The circuit board housing assembly of claim 1, wherein the at least one rivet comprises a recessed portion between the head and the at least two legs, the holding member comprises a washer portion in the at least one aperture, and the washer portion is disposed in the recessed portion.

7. The circuit board housing assembly of claim 1, wherein each of the at least two legs has a tapering portion.

8. The circuit board housing assembly of claim 1, wherein the circuit board is attached to the housing by a bonding material.

* * * * *